(12) United States Patent
Kim et al.

(10) Patent No.: US 11,605,678 B2
(45) Date of Patent: Mar. 14, 2023

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: HongSik Kim, Goyang-si (KR); MinJic Lee, Paju-si (KR); Yeseul Han, Goyang-si (KR); JeongOk Jo, Seoul (KR); Kwanghyun Choi, Seoul (KR)

(73) Assignee: LG Display Co., Ltd., Seoul (KR)

(*) Notice: Subject to any disclaimer, the term of this patent is extended or adjusted under 35 U.S.C. 154(b) by 150 days.

(21) Appl. No.: 17/130,848

(22) Filed: Dec. 22, 2020

(65) Prior Publication Data
US 2021/0202592 A1 Jul. 1, 2021

(30) Foreign Application Priority Data

Dec. 27, 2019 (KR) .......................... 10-2019-0176211

(51) Int. Cl.
*H01L 27/32* (2006.01)
*H01L 51/00* (2006.01)
*H01L 51/56* (2006.01)

(52) U.S. Cl.
CPC .......... *H01L 27/323* (2013.01); *H01L 27/322* (2013.01); *H01L 51/0097* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 10,310,650 B2 | 6/2019 | Heo et al. | |
| 10,777,620 B2 | 9/2020 | Won et al. | |
| 2016/0118625 A1* | 4/2016 | Uesaka | H01L 51/5265 257/40 |
| 2017/0069664 A1 | 3/2017 | Daiki et al. | |
| 2017/0077444 A1 | 3/2017 | Yamazaki et al. | |
| 2017/0185190 A1* | 6/2017 | Jung | G06F 3/04164 |

(Continued)

FOREIGN PATENT DOCUMENTS

| | | |
|---|---|---|
| CN | 107305926 A | 10/2017 |
| CN | 108369788 A | 8/2018 |

(Continued)

OTHER PUBLICATIONS

Office Action dated Jan. 4, 2022, issued in corresponding Japanese Patent Application No. 2020-213747.

(Continued)

*Primary Examiner* — J. E. Schoenholtz
(74) *Attorney, Agent, or Firm* — Morgan, Lewis & Bockius LLP

(57) ABSTRACT

An organic light emitting display device includes a transparent base member, a touch sensor which includes a touch electrode disposed above the transparent base member and a touch protection layer which covers the touch electrode, a black matrix which is disposed below or above the touch sensor and defines a plurality of opening areas, a plurality of color filters which is disposed on the same plane as the black matrix and corresponds to the plurality of opening areas, a first buffer layer disposed above the upper one of the touch sensor and the plurality of color filters, a thin film transistor disposed above the first buffer layer, and an organic light emitting element which is disposed above the thin film transistor and corresponds to the plurality of opening areas.

26 Claims, 17 Drawing Sheets

(56) References Cited

U.S. PATENT DOCUMENTS

| | | | |
|---|---|---|---|
| 2017/0309687 A1 | 10/2017 | Takeyoshi et al. | |
| 2017/0338437 A1 | 11/2017 | Watabe et al. | |
| 2018/0069025 A1 | 3/2018 | Nakamura et al. | |
| 2018/0166507 A1 | 6/2018 | Hwang et al. | |
| 2018/0269263 A1* | 9/2018 | Kim | H01L 27/323 |
| 2018/0286926 A1 | 10/2018 | Kim et al. | |
| 2019/0027542 A1 | 1/2019 | Watabe et al. | |
| 2021/0225882 A1 | 7/2021 | Yamazaki | |
| 2021/0391553 A1* | 12/2021 | Hashimoto | H01L 51/5056 |
| 2022/0123253 A1* | 4/2022 | Seo | H01L 51/5064 |

FOREIGN PATENT DOCUMENTS

| | | |
|---|---|---|
| JP | 2015-034979 A | 2/2015 |
| JP | 2017-054112 A | 3/2017 |
| JP | 2017-130462 A | 7/2017 |
| JP | 2017-199903 A | 11/2017 |
| JP | 2017-212039 A | 11/2017 |
| JP | 2018-173634 A | 11/2018 |
| KR | 10-2016-0013443 A | 2/2016 |
| KR | 10-2018-0074980 A | 7/2018 |
| KR | 10-2018-0131011 A | 12/2018 |
| TW | 201828004 A | 8/2018 |

OTHER PUBLICATIONS

Extended European Search Report dated May 25, 2021, issued in corresponding European Patent Application No. 20213033.2.

Office Action dated Oct. 15, 2021 in connection with the counterpart TW Application No. 109145094.

* cited by examiner

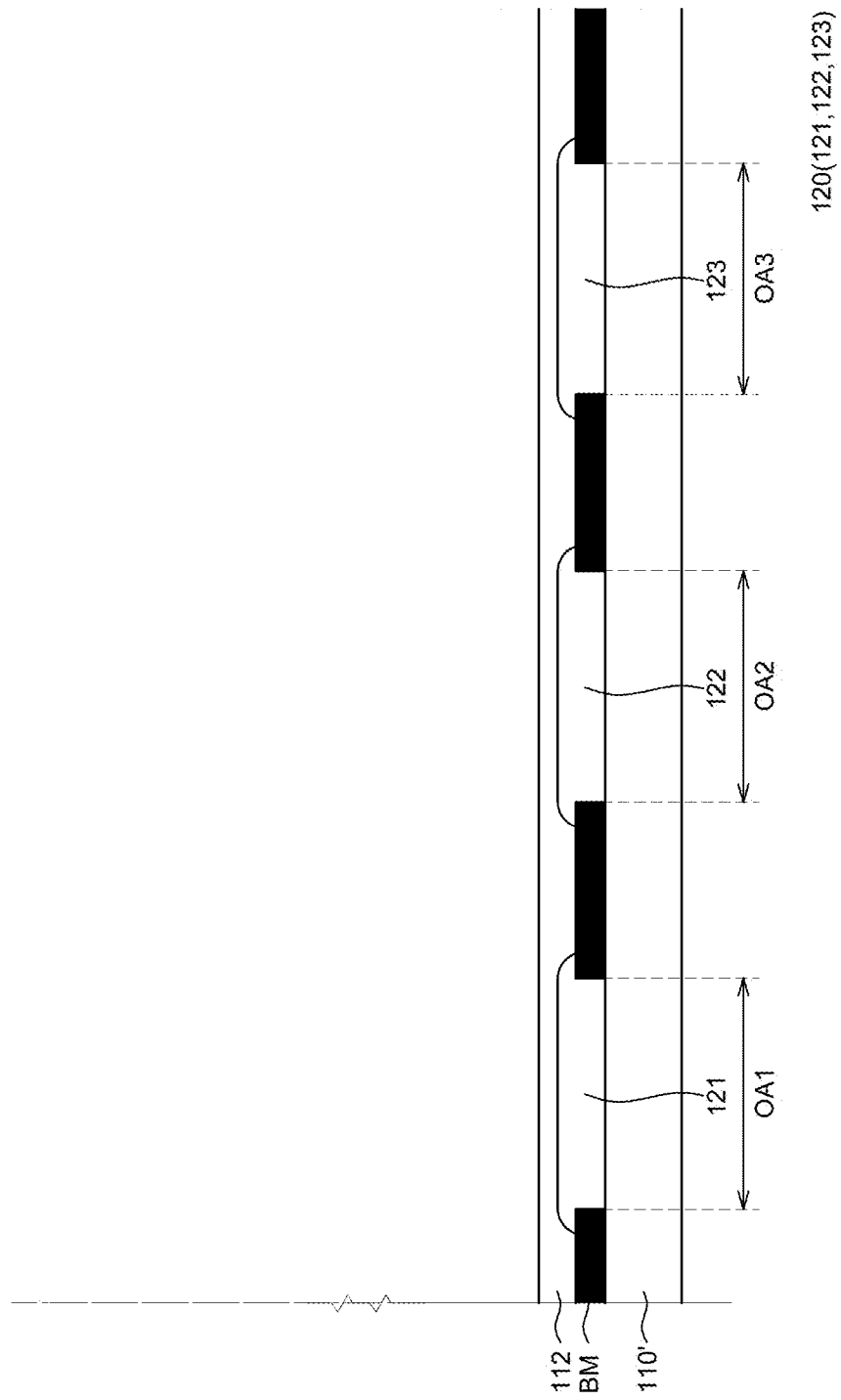

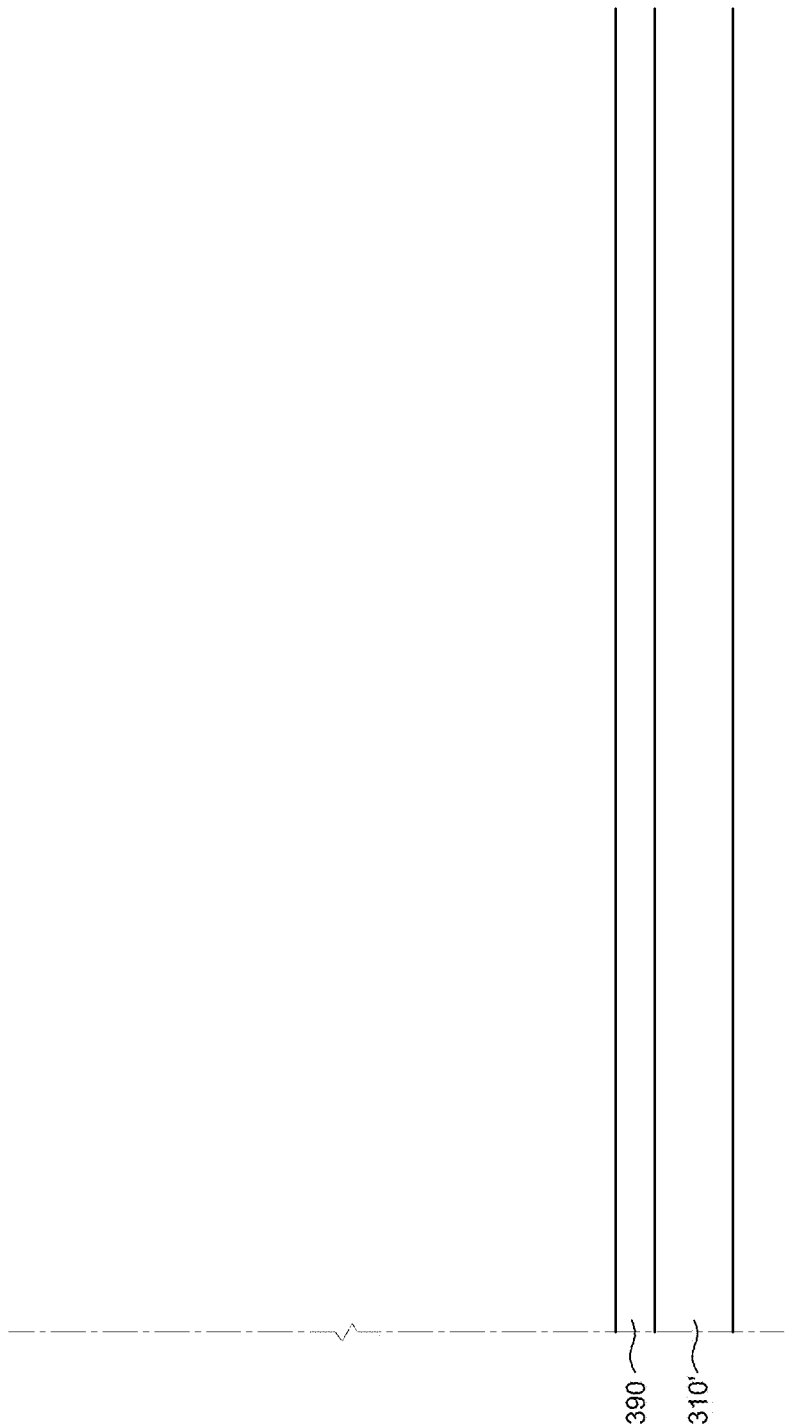

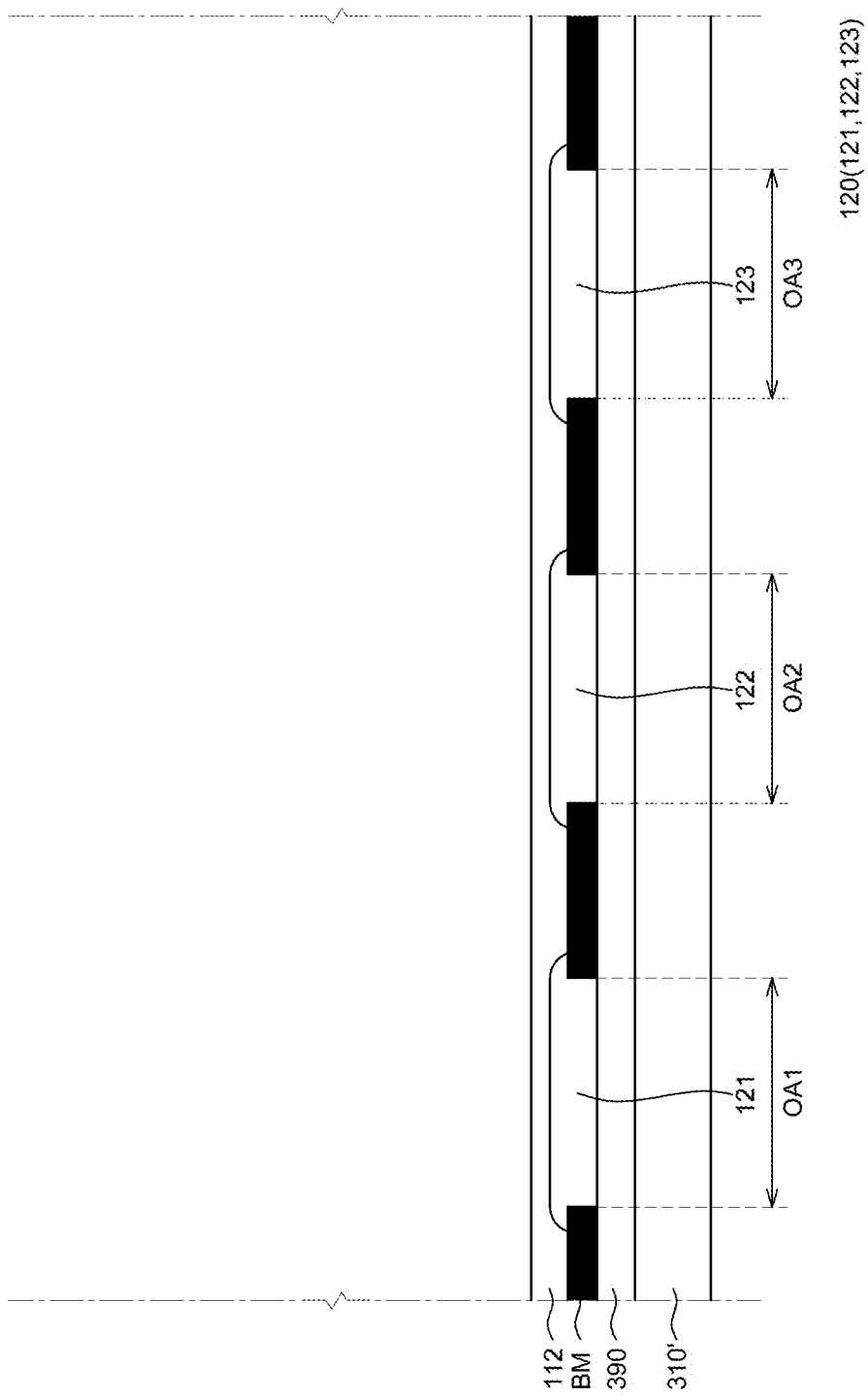

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2019-0176211 filed on Dec. 27, 2019, in the Korean Intellectual Property Office, the disclosure of which is incorporated herein by reference.

BACKGROUND

Technical Field

The present disclosure relates to an organic light emitting display device, and more particularly, to a bottom emission type organic light emitting display device which includes a color filter and a touch sensor and a manufacturing method thereof.

Discussion of the Related Art

The organic light emitting display device (OLED) does not require a separate light source, which is different from a liquid crystal display device (LCD) including a backlight. Therefore, the organic light emitting display device can be manufactured to be light and thin and has process advantages and has a low power consumption due to the low voltage driving. First of all, the organic light emitting display device includes a self-emitting element and includes layers formed of organic thin films so that the flexibility and elasticity are superior to the other display devices and thus it is advantageous to be implemented as a flexible display device.

Generally, the organic light emitting display device is a display device which uses an organic light emitting element in which electrons and holes from a cathode for injecting electrons and an anode for injecting holes are injected into a light emitting layer and excitons formed by coupling the injected electrons and holes are dropped from an excited state to a ground state to emit light.

In the meantime, recently, the organic light emitting display device is formed as a touch screen integrated display device including a touch screen panel which recognizes the touch of a user. Specifically, as electronic devices having a touch input function such as a smart phone or a tablet PC are widely utilized, demands for a display device which is capable of sensing various touch inputs are increased. However, in many cases, the touch screen panel is attached to a front surface of the display device by means of an adhesive. In this case, the touch screen panel is separately manufactured to be attached to the front surface of the display panel so that an attaching process is added, which increases a process complexity and a cost.

In the meantime, generally, the organic light emitting display device includes an anode, a cathode, and an organic light emitting layer disposed therebetween. However, the cathode is formed using a metal material having a high reflectance so that the external light is reflected by the metal material to deteriorate reflective visibility and a contrast ratio. Therefore, in order to reduce the reflection by the external light, a polarizing plate is provided below a cover member to absorb the external light. The polarizing plate is a film having a predetermined light transmittance and absorbs external light and reflected light thereof to suppress the deterioration of the contrast ratio. However, the polarizing plate is an expensive member and has a relatively large thickness so that it is not appropriate for reduction of the thickness. Further, there is a problem in that the polarizing plate also partially absorbs light emitted from the organic light emitting layer to deteriorate the luminous efficiency.

SUMMARY

First, the inventors of the present disclosure invented an organic light emitting display device which applies an anti-reflection layer in which a color filter and a black matrix are integrated, instead of the polarizing plate to solve the increased cost and the increased thickness of the display device due to the polarizing plate. The anti-reflection layer with the above-mentioned structure is thinner than the polarizing plate to be applicable to various types of organic light emitting display devices such as a curved organic light emitting display device or a foldable organic light emitting display device.

Next, in order to improve the increased cost and the increased thickness of the display device when a separate touch screen panel is attached to the display device, the inventors of the present disclosure considered a method of forming a touch sensor in the organic light emitting display device by directly forming a touch electrode on an encapsulation layer for protecting an organic light emitting element.

However, the inventors of the present disclosure recognized that when the anti-reflection layer in which the color filter and the black matrix are integrated as described above and the touch sensor are formed above the organic light emitting display element, the performance and the durability of the color filter and the touch sensor are not sufficient. Specifically, a process of forming the color filter and the touch sensor which are formed of an organic material and an inorganic material is desirably performed at a high temperature. However, the organic light emitting element located below the color filter and the touch sensor is vulnerable to heat so that when the color filter and the touch sensor are formed by a high temperature process, the organic light emitting element may be damaged. Therefore, in order to protect the organic light emitting element, when the color filter and the touch sensor are formed by a low temperature process, an organic layer which configures the color filter and the touch sensor are cracked or damaged, so that the durability is significantly deteriorated.

Accordingly, the inventors of the present disclosure invented an organic light emitting display device with a new structure which formed a polarizing plate and a touch sensor in the display device to improve the durability and the luminous efficiency while reducing the thickness of the entire display device.

Accordingly, embodiments of the present disclosure are directed to an organic light emitting display device and a method for manufacturing the same that substantially obviate one or more of the problems due to limitations and disadvantages of the related art.

An object to be achieved by the present disclosure is to provide an organic light emitting display device which forms an anti-reflection layer including a black matrix and a color filter and a touch sensor in the display device to improve the reflective visibility and implement the touch while reducing the entire thickness.

Another object to be achieved by the present disclosure is to provide an organic light emitting display device in which the durability and the reliability of not only the organic light emitting element, but also the anti-reflection layer and the touch sensor are improved.

Still another object to be achieved by the present disclosure is to provide a manufacturing method of an organic light emitting display device which simplifies the entire process of the organic light emitting display device and reduces the process cost.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises: a transparent base member; a touch sensor which includes a touch electrode disposed above the transparent base member and a touch protection layer which covers the touch electrode; a black matrix which is disposed below or above the touch sensor and defines a plurality of opening areas; a plurality of color filters which is disposed on the same plane as the black matrix and corresponds to the plurality of opening areas; a first buffer layer disposed above the upper one of the touch sensor and the plurality of color filters; a thin film transistor disposed above the first buffer layer; and an organic light emitting element which is disposed above the thin film transistor and corresponds to the plurality of opening areas.

In another aspect, a manufacturing method of an organic light emitting display device comprises: forming a black matrix, a plurality of color filters, and a touch sensor on a carrier glass substrate; forming a first buffer layer above the plurality of color filters and the touch sensor; forming a thin film transistor on the first buffer layer; forming a planarization layer to cover the thin film transistor; forming an organic light emitting element including an anode, an organic light emitting layer, and a cathode on the planarization layer; and forming an encapsulation layer on the organic light emitting element.

Other detailed matters of the exemplary embodiments are included in the detailed description and the drawings.

According to the present disclosure, a black matrix and a color filter which serve as an anti-reflection layer and a touch sensor are formed in the display device to improve the reflective visibility, implement the touch, and reduce the entire thickness of the organic light emitting display device.

According to the present disclosure, the durability and the reliability of not only the organic light emitting element, but also the anti-reflection layer and the touch sensor may be improved.

According to the present disclosure, a manufacturing method of an organic light emitting display device with reduced process steps and reduced process cost may be provided.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIGS. 3A to 3F are cross-sectional views for explaining a manufacturing method of an organic light emitting display device according to an exemplary embodiment of the present disclosure;

FIGS. 6A to 6G are cross-sectional views for explaining a manufacturing method of an organic light emitting display device according to still another exemplary embodiment of the present disclosure.

DETAILED DESCRIPTION

Figure 1:
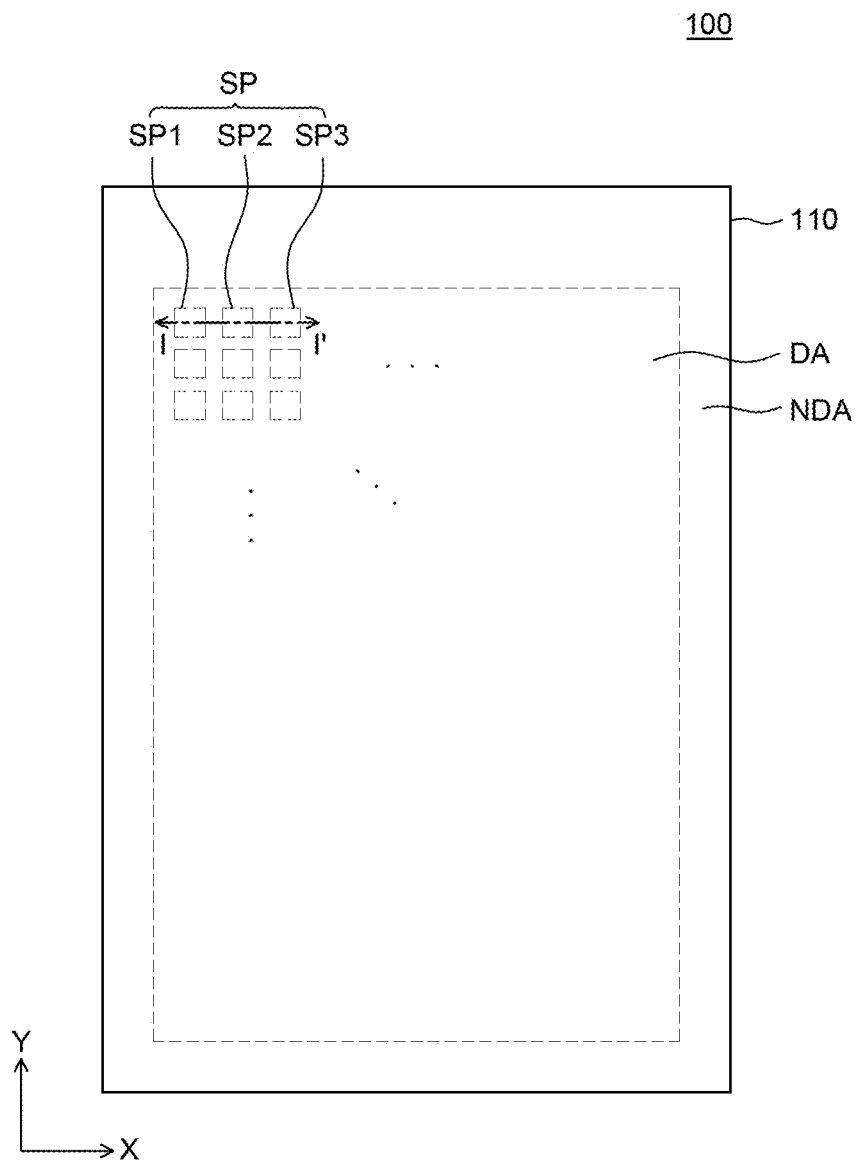
FIG. 1 is a schematic exploded perspective view for explaining an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
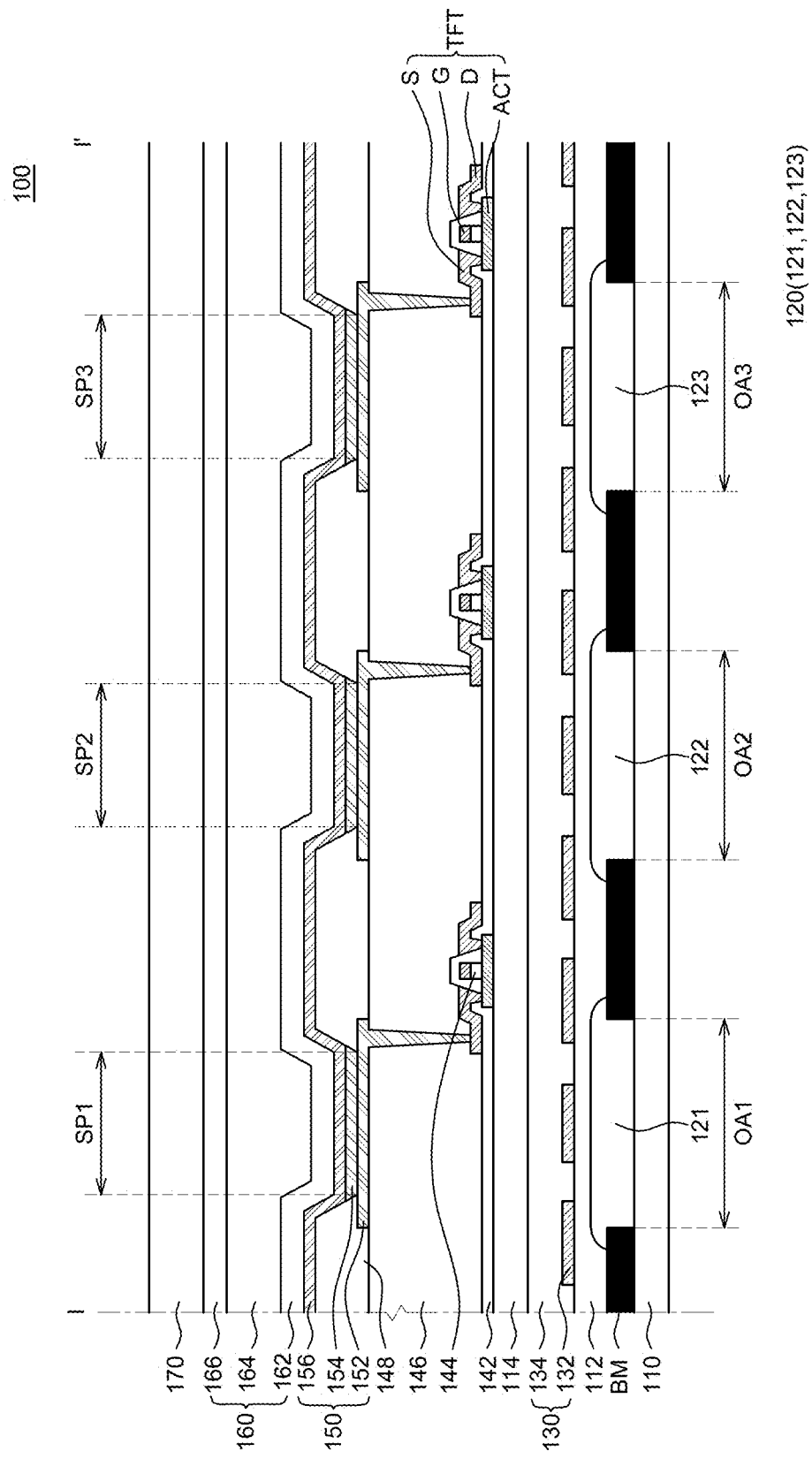
FIG. 2 is a schematic cross-sectional view taken along the line I-I' of FIG. 1.

FIG. 1 is a schematic exploded perspective view for explaining an organic light emitting display device according to an exemplary embodiment of the present disclosure. FIG. 2 is a schematic cross-sectional view taken along the line I-I' of FIG. 1.

Referring to FIGS. 1 and 2, an organic light emitting display device 100 includes a transparent base member, a black matrix BM, a plurality of color filters 120, a touch sensor 130, an organic light emitting element 150, and an encapsulation layer 160.

The organic light emitting display device 100 according to an exemplary embodiment of the present disclosure may be configured as a bottom emission type. That is, the organic light emitting display device 100 may emit light to a rear surface of the transparent base member. According to the bottom emission type, light emitted from the organic light emitting element 150 is emitted to a lower portion of the transparent base member on which the organic light emitting element 150 is formed. In the case of a bottom emission type, in order to cause light emitted from the organic light emitting element 150 to travel to the lower portion of the transparent base member, the anode 152 may be formed of a transparent conductive material and the cathode 156 may be formed of a metal material having a high reflectance, which will be described below.

Referring to FIG. 1, the transparent base member is a substrate which supports and protects several components of the organic light emitting display device 100. The organic light emitting display device 100 according to the exemplary embodiment of the present disclosure is a bottom emission type so that in order to cause the light to travel downwardly, the transparent base member may be formed of an insulating material having transparency. For example, the transparent base member may be formed of a glass substrate or a transparent flexible film. Hereinafter, it is described that the transparent base member illustrated in FIG. 1 is a glass substrate 110.

The glass substrate 110 includes a display area DA and a non-display area NDA. The display area DA is an area where a plurality of pixels is disposed to substantially display images. In the display area DA, a display element which displays images and various driving elements for driving the display element may be disposed.

A thickness of the glass substrate 110 may be 30 μm to 200 μm or 50 μm to 100 μm. When the thickness of the glass substrate 110 satisfies the above-mentioned range, the glass substrate may support the components of the organic light emitting display device 100 and also implement the display device to be folded or bent.

Even though not illustrated in FIG. 2, in the glass substrate 110, an opening pattern or a concave pattern corresponding to a folding area or a bending area may be formed. Specifically, the glass substrate 110 includes an inner surface which faces the organic light emitting element 150 and an outer surface which is opposite to the inner surface and serves as an emission surface of the organic light emitting display device 100. In this case, the opening pattern or the concave pattern may be a groove which is formed inwardly from the outer surface to allow the organic light emitting display device to be folded or bent. The opening pattern or the concave pattern may have a structure in which an opening unit (or a concave unit) and a blocking unit (or a convex unit) are continuously alternately disposed. Therefore, the opening pattern or the concave pattern may impart a flexible property to the glass substrate 110.

A plurality of pixels may be included in the display area DA. The plurality of pixels is disposed in a matrix and each of the plurality of pixels includes a plurality of sub pixels SP. Each sub pixel SP is an element which represents one color and is defined by areas where a plurality of gate lines disposed in a first direction intersects a plurality of data lines disposed in a second direction which is different from the first direction. Here, the first direction may be a horizontal direction (an X-axis direction) of FIG. 1 and the second direction may be a vertical direction (a Y-axis direction) of FIG. 1 but are not limited thereto. Each sub pixel SP includes an emission area where light is emitted and a non-emission area where light is not emitted, but in the specification, only the emission area where the light is emitted is defined as a sub pixel SP. Each of the plurality of pixels includes a first sub pixel SP1, a second sub pixel SP2, and a third sub pixel SP3. The first sub pixel SP1 may be a red pixel, the second sub pixel SP2 may be a green pixel, and the third sub pixel SP3 may be a blue pixel, but are not limited thereto.

Each sub pixel SP may include an organic light emitting element 150 and a driving element. In this case, the driving element may include a switching transistor and a driving transistor. The driving element may be electrically connected to signal lines such as a gate line and a data line which are connected to a gate driver and a data driver disposed in the non-display area NDA.

The non-display area NDA is disposed in a surrounding area of the glass substrate 110 and in the non-display area, images are not displayed. The non-display area NDA is disposed so as to enclose the display area DA. Various components for driving a plurality of sub pixels SP disposed in the display area DA may be disposed in the non-display area NDA. For example, a driving IC, a driving circuit, a signal line, and a flexible film which supply a signal for driving the plurality of sub pixels SP may be disposed. In this case, the driving IC may include a gate driver and a data driver. The driving IC and the driving circuit may be disposed in a gate in panel (GIP) manner, a chip on film (COF) manner, a tape automated bonding (TAB) manner, a tape carrier package (TCP) manner, or a chip on glass (COG) manner.

Referring to FIG. 2, the black matrix BM and the plurality of color filters 120 are disposed on the glass substrate 110. The black matrix BM and the plurality of color filters 120 are formed on the same plane and are disposed on the glass substrate 110 to be in direct contact with the glass substrate 110. In the present disclosure, the black matrix BM and the plurality of color filters 120 are integrally formed to serve as an anti-reflection layer.

The black matrix BM is disposed on the glass substrate 110. Further, the black matrix BM may be disposed so as to correspond to a position where a bank 148 is formed. In this case, the black matrix BM is disposed between the plurality of color filters 120 to divide the color filters 121, 122, and 123, respectively. The black matrix BM may suppress the color mixture of light which passes through the respective color filters 121, 122, and 123 and define a plurality of opening areas which allows light emitted from the organic light emitting element 150 to be emitted to the outside. Each opening area OA1, OA2, OA3 is an area through which the light emitted from the organic light emitting element 150 disposed on the black matrix BM and the plurality of color filters 120 passes. The opening areas OA1, OA2, OA3 independently represent specific colors by a corresponding organic light emitting element 150, respectively. Further, the black matrix BM absorbs external light. Therefore, the deterioration of the visibility and the contrast ratio of the organic light emitting display device 100 due to the external light may be minimized.

The black matrix BM may be formed of an organic material. The black matrix BM includes a base resin and a black material. The base resin may be one or more selected from cardo-based resin, epoxy-based resin, acrylate-based resin, siloxane-based resin, and polyimide, but is not limited thereto. The black material may be a black pigment selected from a carbon-based pigment, a metal oxide-based pigment, and an organic pigment. For example, the carbon-based pigment may be carbon black. For example, the metal oxide-based pigment may be titanium black TiNxOy or Cu—Mn—Fe-based black pigment, but is not limited thereto. For example, the organic pigment may be selected from lactam black, perylene black, and aniline black, but is not limited thereto. Further, as the black material, an RGB black pigment including a red pigment, a blue pigment, and a green pigment may be used.

The plurality of color filters 120 is disposed on the glass substrate 110 and is disposed on the same plane as the black matrix BM. The plurality of color filters 120 is disposed so as to correspond to the plurality of sub pixels SP. In this case, each of the plurality of color filters 120 is disposed in each of the opening areas OA1, OA2, OA3 defined by the black matrix BM. Specifically, the plurality of color filters 120 includes a first color filter 121 corresponding to the first sub pixel SP1, a second color filter 122 corresponding to the second sub pixel SP2, and a third color filter 123 corresponding to the third sub pixel SP3. The first color filter 121 is disposed in the first opening area OA1 corresponding to the first sub pixel SP1, the second color filter 122 is disposed in the second opening area OA2 corresponding to the second sub pixel SP2, and the third color filter 123 is disposed in the third opening area OA3 corresponding to the third sub pixel SP3. In this case, when the first sub pixel SP1 is a red sub pixel, the first color filter 121 is a red color filter. Further, when the second sub pixel SP2 is a green sub pixel, the second color filter 122 is a green color filter and when the third sub pixel SP3 is a blue sub pixel, the third color filter 123 is a blue color filter. In this case, the organic light emitting display device 100 has an excellent color reproduction property.

The first color filter 121, the second color filter 122, and the third color filter 123 independently include a transparent base resin and a color development material. For example, the transparent base resin may be one selected from polyacrylate, polymethyl methacrylate, polyimide, polyvinyl alcohol, polyethylene, polypropylene, polystyrene, and polyethylene terephthalate, but is not limited thereto. The color development material absorbs light in a specific wavelength band and transmits light in the other wavelength band. For example, the red color filter includes a red color development material which transmits light in a red wavelength band and absorbs light in green and blue wavelength bands. More specifically, a red color development material may be a parylene-based compound or a diketo-pyrrolopyrrole-based compound. Further, a green color development material may be a phthalocyanine-based compound. Further, a blue color development material may be a copper phthalocyanine-based compound or an anthraquinone-based compound. However, the color development material is not limited thereto and any material which transmits light in the red, blue, and green wavelength bands may be used without limitations.

A second buffer layer 112 is formed on the black matrix BM and the plurality of color filters 120. The second buffer layer 112 may protect or planarize the black matrix BM and the plurality of color filters 120. Specifically, the second buffer layer 112 suppresses the permeation of moisture or oxygen from the outside to protect the black matrix BM and the plurality of color filters 120. Further, the second buffer layer 112 may minimize the damage of the black matrix BM and the plurality of color filters 120 caused during the process of forming a touch electrode 132 of the touch sensor 130 located thereabove.

The second buffer layer 112 may be formed of an inorganic material having an excellent barrier property. Therefore, the permeation of moisture or oxygen may be minimized. For example, the second buffer layer 112 may be formed of an inorganic material such as silicon nitride SiNx, silicon oxide SiOx, or aluminum oxide AlOx, but is not limited thereto.

Further, the second buffer layer 112 may be formed by a plurality of layers to planarize the black matrix BM and the plurality of color filters 120 and enhance adhesiveness between the plurality of color filters 120 and the touch sensor 130 located thereabove. For example, the second buffer layer 112 may include a first layer which is formed of an organic material to planarize an upper portion of the plurality of color filters 120 and a second layer which is disposed on the first layer and is formed of the above-described inorganic material to impart a barrier property. For example, the first layer may be formed of a transparent insulating resin such as acrylic resin, polyester-based resin, epoxy resin, or silicon-based resin and the second layer may be formed of the inorganic material described above.

The touch sensor 130 is disposed on the second buffer layer 112 to impart a touch sensing function to the organic light emitting display device 100. The touch sensor 130 may be directly formed on the second buffer layer 112 without using an adhesive member. As the touch sensor 130 is directly formed on the second buffer layer 112, the adhesive member which attaches between the touch sensor 130 and the color filters is omitted so that the thickness of the organic light emitting display device 100 may be reduced.

The touch sensor 130 includes a touch electrode 132 and a touch protection layer 134. The touch electrode 132 may be directly formed on the second buffer layer 112 without using an adhesive member. The touch electrode 132 is an electrode which senses a touch input and may be configured by a sensing electrode and a driving electrode and detect a touch coordinate by sensing a change of the capacitance between the sensing electrode and the driving electrode. For example, the driving electrode is disposed on the second buffer layer 112 and the sensing electrode is disposed on the same plane as the driving electrode. As another example, a touch insulating layer is disposed on the driving electrode and the sensing electrode is disposed on the touch insulating layer. The arrangement of the touch electrode 132 is not limited thereto and may vary if necessary.

The touch electrode 132 may be formed of a transparent metal material which may transmit light, such as indium tin oxide ITO or indium zinc oxide IZO. The touch electrode 132 may have various shapes such as a rectangular shape, an octagonal shape, a circular shape, or a rhombus shape.

The touch protection layer 134 is disposed on the touch electrode 132. The touch protection layer 134 suppresses the short-circuit or damage of the touch electrode 132 and planarizes an upper surface of the touch electrode 132. The touch protection layer 134 may be formed of a transparent insulating resin such as acrylic resin, polyester-based resin, epoxy resin, or silicon-based resin.

A first buffer layer 114 is disposed on the touch sensor 130. The first buffer layer 114 protects the black matrix BM, the plurality of color filters 120, and the touch sensor 130. Further, the first buffer layer 114 protects the thin film transistor TFT from impurities and gas such as alkali ion leaked from the black matrix BM, the plurality of color filters 120, and the touch sensor 130. The first buffer layer 114 may be formed of an inorganic material such as silicon nitride SiNx, silicon oxide SiOx, or aluminum oxide AlOx. The first buffer layer 114 may be formed as a single layer and may be formed with a multi-layered structure if necessary. For example, the first buffer layer 114 may include a multi buffer and/or an active buffer.

On the first buffer layer 114, a thin film transistor TFT including a gate electrode G, an active layer ACT, a source electrode S, and a drain electrode D is disposed. For the convenience of description, in FIG. 2, only a driving thin film transistor among various thin film transistors TFT which may be included in the organic light emitting display device 100 is illustrated, but other transistors such as a switching thin film transistor may also be disposed.

In the meantime, it is described that the thin film transistor TFT illustrated in FIG. 2 has a coplanar structure as an example, but the present disclosure is not limited thereto and a thin film transistor TFT having an inverted staggered structure may also be used. Further, the thin film transistor TFT may be implemented as a top gate type thin film transistor in which the gate electrode G is disposed on the active layer ACT, but may also be implemented as a bottom gate type thin film transistor in which the gate electrode G is disposed below the active layer ACT.

The active layer ACT is disposed on the first buffer layer 114. When the thin film transistor TFT is driven, a channel is formed in the active layer ACT. The active layer ACT may be formed of an oxide semiconductor or amorphous silicon a-Si, polycrystalline silicon poly-Si, or an organic semiconductor, but is not limited thereto.

A gate insulating layer 144 is disposed on the active layer ACT. The gate insulating layer 144 insulates the active layer ACT from the gate electrode G. The gate insulating layer 144 may be formed as a single layer or a multi-layer of silicon nitride SiNx or silicon oxide SiOx. As illustrated in FIG. 2, the gate insulating layer 144 may be patterned to have the same width as the gate electrode G or formed over the entire glass substrate 110 but is not limited thereto.

The gate electrode G is disposed on the gate insulating layer 144. The gate electrode G is disposed on the gate insulating layer 144 so as to overlap the channel area of the active layer ACT. The gate electrode G may be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 142 is disposed on the first buffer layer 114 and the gate electrode G. The interlayer insulating layer 142 insulates the gate electrode G from the source electrode S and the drain electrode D. The interlayer insulating layer 142 may be formed as a single layer or a multi-layer of silicon nitride SiNx or silicon oxide SiOx. In the interlayer insulating layer 142, a contact hole through which the source electrode S and the drain electrode D are in contact with a source area and a drain area of the active layer ACT, respectively, is formed.

The source electrode S and the drain electrode D are disposed on the interlayer insulating layer 142. The source electrode S and the drain electrode D are electrically connected to the active layer ACT through the contact hole formed in the interlayer insulating layer 142. The source electrode S and the drain electrode D may be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but are not limited thereto.

Even though it is not illustrated in FIG. 2, a passivation layer may be additionally disposed on the thin film transistor TFT to protect the thin film transistor TFT. In the passivation layer, a contact hole which exposes the source electrode S or the drain electrode D of the thin film transistor TFT may be formed. The passivation layer may be configured as a single layer or a multi-layer of silicon nitride SiNx or silicon oxide SiOx.

A planarization layer 146 is disposed on the passivation layer to planarize an upper portion of the thin film transistor TFT. In the planarization layer 146, a contact hole which exposes the source electrode S or the drain electrode D of the thin film transistor TFT is formed. The planarization layer 146 may be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

The organic light emitting element 150 is disposed on the planarization layer 146. The organic light emitting element 150 includes a first organic light emitting element disposed in a first sub pixel SP1 area, a second organic light emitting element disposed in a second sub pixel SP2 area, and a third organic light emitting element disposed in a third sub pixel SP3 area. Each of the organic light emitting elements 150 includes an anode 152, an organic light emitting layer 154, and a cathode 156.

The anode 152 is disposed on the planarization layer 146. The anode 152 is disposed on the planarization layer 146 to be electrically connected to the source electrode S or the drain electrode D through the contact hole formed in the planarization layer 146. The anode 152 is formed of a conductive material having a high work function to supply holes to the organic light emitting layer 154. The anode 152 may be a transparent conductive layer which is formed of transparent conductive oxide TCO. For example, the anode 152 may be formed by one or more selected from transparent conductive oxides such as indium tin oxide ITO, indium zinc oxide IZO, indium tin zinc oxide ITZO, tin oxide SnO2, zinc oxide ZnO, indium copper oxide ICO, and aluminum:zinc oxide Al:ZnO, AZO, but is not limited thereto. Since the organic light emitting display device 100 of the exemplary embodiment of the present disclosure is a bottom emission type, the anode 152 may be formed of only the transparent conductive layer. The anode 152 may be separately formed for each of the first sub pixel SP1, the second sub pixel SP2, and the third sub pixel SP3.

The bank 148 is disposed on the anode 152 and the planarization layer 146. The bank 148 may cover an edge of the anode 152 of the organic light emitting element 150 to define an emission area. The bank 148 may be formed of an insulating material which insulates anodes 152 of adjacent sub pixels SP1, SP2, and SP3 from each other. Further, the bank 148 may be configured by a black bank having high light absorptance to suppress color mixture between adjacent sub pixels SP1, SP2, and SP3. For example, the bank 148 may be formed of polyimide resin, acrylic resin, or benzocyclobutene resin, but is not limited thereto.

The cathode 156 is disposed on the anode 152. The cathode 156 may be formed of a metal material having a low work function to smoothly supply electrons to the organic light emitting layer 154. Since the organic light emitting display device 100 of the exemplary embodiment of the present disclosure is a bottom emission type, in order to cause the light emitted from the organic light emitting element 150 to travel to the lower portion of the glass substrate 110, the cathode 156 may be formed of a metal material having a high reflectance. For example, the cathode 156 may be formed of a metal material selected from calcium (Ca), barium (Ba), aluminum (Al), silver (Ag), and alloys including one or more of them, but is not limited thereto.

Referring to FIG. 2, even though it is illustrated that the cathode 156 is not patterned, but formed on the anode 152 as one layer, the cathode 156 may be separately disposed for every sub pixel SP, like the anode 152. That is, the cathode 156 is formed in the first sub pixel SP1, the second sub pixel SP2, and the third sub pixel SP3 as a single layer.

The organic light emitting layer 154 is disposed between the anode 152 and the cathode 156. The organic light emitting layer 154 is a layer in which electrons and holes are coupled to emit light. The organic light emitting layer 154 of the first organic light emitting element may be a red organic light emitting layer, the organic light emitting layer 154 of the second organic light emitting element may be a green organic light emitting layer, and the organic light emitting layer 154 of the third organic light emitting element may be a blue organic light emitting layer.

In order to improve luminous efficiency of the organic light emitting element 150, a hole injection layer, a hole transport layer, an electron transport layer, and an electron injection layer may be further included. For example, the hole injection layer and the hole transport layer may be disposed between the anode 152 and the organic light emitting layer 154 and the electron transport layer and the electron injection layer may be disposed between the organic light emitting layer 154 and the cathode 156. Further, a hole blocking layer or an electron blocking layer may be disposed to further improve a recombination efficiency of the holes and electrons in the organic light emitting layer 154.

The encapsulation layer 160 is disposed on the organic light emitting element 150. The encapsulation layer 160 may cover the organic light emitting element 150. The encapsulation layer 160 may protect the organic light emitting element 150 from moisture, oxygen, and impacts of the outside. The encapsulation layer 160 may be formed as a multi-layered structure in which an inorganic layer formed of an inorganic insulating material and an organic layer formed of an organic material are laminated. For example, the encapsulation layer 160 may be configured by at least one organic layer and at least two inorganic layers and have a multi-layered structure in which the inorganic layers and the organic layer are alternately laminated but is not limited thereto. For example, the encapsulation layer 160 may have a triple-layered structure including a first inorganic layer 162, an organic layer 164, and a second inorganic layer 166. In this case, the first inorganic layer 162 and the second inorganic layer 166 may be independently formed of one or more selected from silicon nitride SiNx, silicon oxide SiOx, aluminum oxide AlOx, and silicon oxynitride SiON but is not limited thereto. Further, the organic layer 164 may be formed of one or more selected from epoxy resin, polyimide, polyethylene, and silicon oxycarbide SiOC, but is not limited thereto.

A cover base member 170 may be disposed on the encapsulation layer 160. The cover base member 170 protects the organic light emitting element 150 from moisture, oxygen, impacts from the outside, together with the encapsulation layer 160. The cover base member 170 may be a metal material such as stainless steel (SUS) or a plastic material such as polymethylmethacrylate, polycarbonate, polyvinyl alcohol, acrylonitrile-butadiene-styrene, or polyethylene terephthalate.

In the organic light emitting display device according to the exemplary embodiment of the present disclosure, an anti-reflection layer including a black matrix and a color filter is disposed on the glass substrate and a touch sensor including a touch electrode is formed on the anti-reflection layer. The organic light emitting display device according to the exemplary embodiment of the present disclosure is a bottom emission type organic light emitting display device in which an organic light emitting element is disposed on the anti-reflection layer and the touch sensor to emit light toward the glass substrate disposed therebelow. According to the organic light emitting display device according to the exemplary embodiment of the present disclosure, the anti-reflection layer and the touch sensor are disposed between the glass substrate and the organic light emitting element. Therefore, reflection luminosity is improved, the touch can be implemented, and the entire thickness of the organic light emitting display device may be reduced. Specifically, the color filter and the touch sensor which require the high temperature process are disposed below so as to be formed prior to the organic light emitting element which is vulnerable to the high temperature so that the durability and the reliability of the organic light emitting display device are significantly improved.

Hereinafter, a manufacturing method of an organic light emitting display device according to an exemplary embodiment of the present disclosure will be described with reference to FIGS. 3A to 3F.

FIGS. 3A to 3F are cross-sectional views for explaining a manufacturing method of an organic light emitting display device according to an exemplary embodiment of the present disclosure.

Referring to FIG. 3A, a carrier glass substrate 110' is prepared. The carrier glass substrate 110' serves as an auxiliary substrate which supports components disposed on an upper portion during the processes of the organic light emitting display device. The carrier glass substrate 110' has a low reactivity for processes such as etching or thermal treatment of a semiconductor material and a metal material. A thickness of the carrier glass substrate 110' may be selected in a range which has a rigidity so as not to cause shape deformation due to a load and has a weight easy to be carried during the manufacturing process. For example, the thickness of the carrier glass substrate 110' may be 400 µm to 800 µm or 500 µm to 650 µm.

The black matrix BM is formed on the carrier glass substrate 110'. The black matrix BM may be formed in a position where wiring lines and a driving element such as a thin film transistor TFT to be disposed thereon later are formed. The black matrix BM divides a first opening area OA1, a second opening area OA2, and a third opening area OA3.

The plurality of color filters 120 is formed on the carrier glass substrate 110' on which the black matrix BM is formed. The plurality of color filters 120 may be disposed to have a color determined for every sub pixel. For example, a first color filter 121 is formed by applying an organic material including a red pigment in the first opening area OA1 corresponding to the first sub pixel SP1 and performing a photo process. Further, a second color filter 122 is formed in the second opening area OA2 corresponding to the second sub pixel SP2 by applying an organic material including a green pigment and performing a photo process. Further, a third color filter 123 is formed by applying an organic material including a blue pigment in the third opening area OA3 corresponding to the third sub pixel SP3 and performing a photo process. Even though in FIG. 3A, it is illustrated that the first color filter 121, the second color filter 122, and the third color filter 123 are formed to be spaced apart from one another, two adjacent color filters may be formed on the black matrix BM to overlap each other.

The second buffer layer 112 is formed on the entire surface of the carrier glass substrate 110' on which the black matrix BM and the plurality of color filters 120 are completed. The second buffer layer 112 may be formed of an inorganic material such as silicon nitride SiNx, silicon oxide SiOx, or aluminum oxide AlOx and deposited by a chemical vapor deposition (CVD) process or a plasma enhanced chemical vapor deposition (PECVD) process but is not limited thereto.

In the meantime, before forming the second buffer layer 112, an organic layer which planarizes a top surface of the black matrix BM and the plurality of color filters 120 may be formed.

Figure 3B:
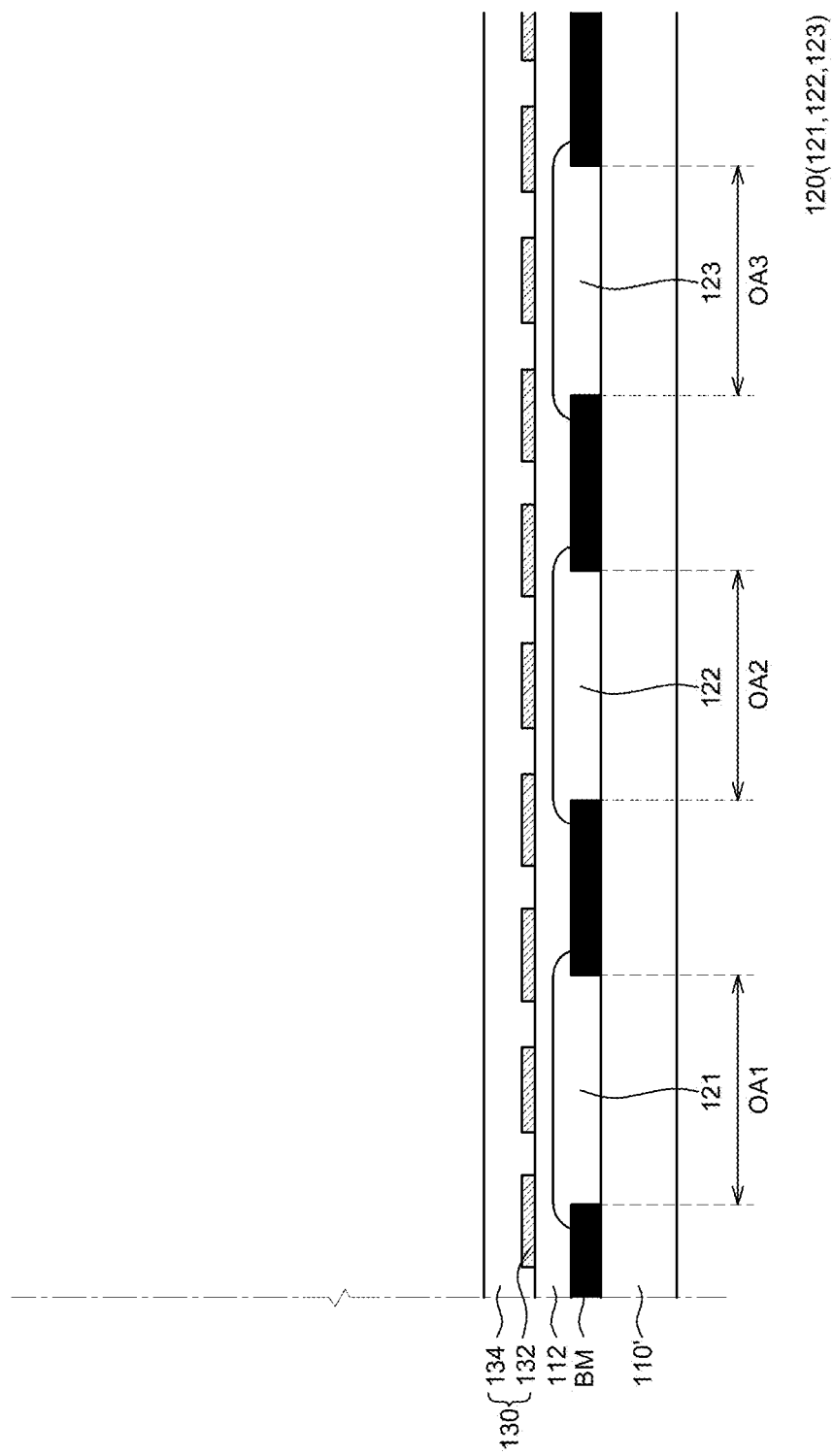

Referring to FIG. 3B, the touch sensor 130 is formed on the second buffer layer 112.

After depositing a conductive layer on the second buffer layer 112, the touch electrode 132 may be patterned by a photolithography process and an etching process using a photo mask. Specifically, the touch electrode 132 may be configured by a sensing electrode and a driving electrode. For example, after depositing a first conductive layer on the second buffer layer 112, a plurality of driving electrodes, a plurality of sensing electrodes, and a connecting electrode which connects the plurality of driving electrodes are formed by the photolithography process and the etching process. A touch insulating layer having a contact hole is formed on the plurality of driving electrodes, the plurality of sensing electrodes, and the connecting electrode. A bridge electrode is formed on the touch insulating layer so that the plurality of sensing electrodes is electrically connected through a contact hole. As described above, in the touch electrode 132, the driving electrode and the sensing electrode are formed on the same plane on the second buffer layer 112. However, as another example, a touch insulating layer is disposed on the driving electrode and the sensing electrode is disposed on the touch insulating layer. The touch electrode 132 may be formed in various ways depending on the structure of the touch sensor 130. Further, the touch electrode 132 may be formed by a physics vapor deposition method such as a sputtering method.

The touch electrode 132 may be formed of a transparent metal material which transmits the light, such as indium tin oxide ITO or indium zinc oxide IZO. In order to impart high transparency and low resistance characteristics, the touch electrode 132 may be formed at a high temperature.

The touch protection layer 134 is disposed on the touch electrode 132. For example, a transparent insulating resin such as acrylic resin, polyester-based resin, or silicon-based resin is laminated on an entire upper surface of the touch electrode 132.

Figure 3C:
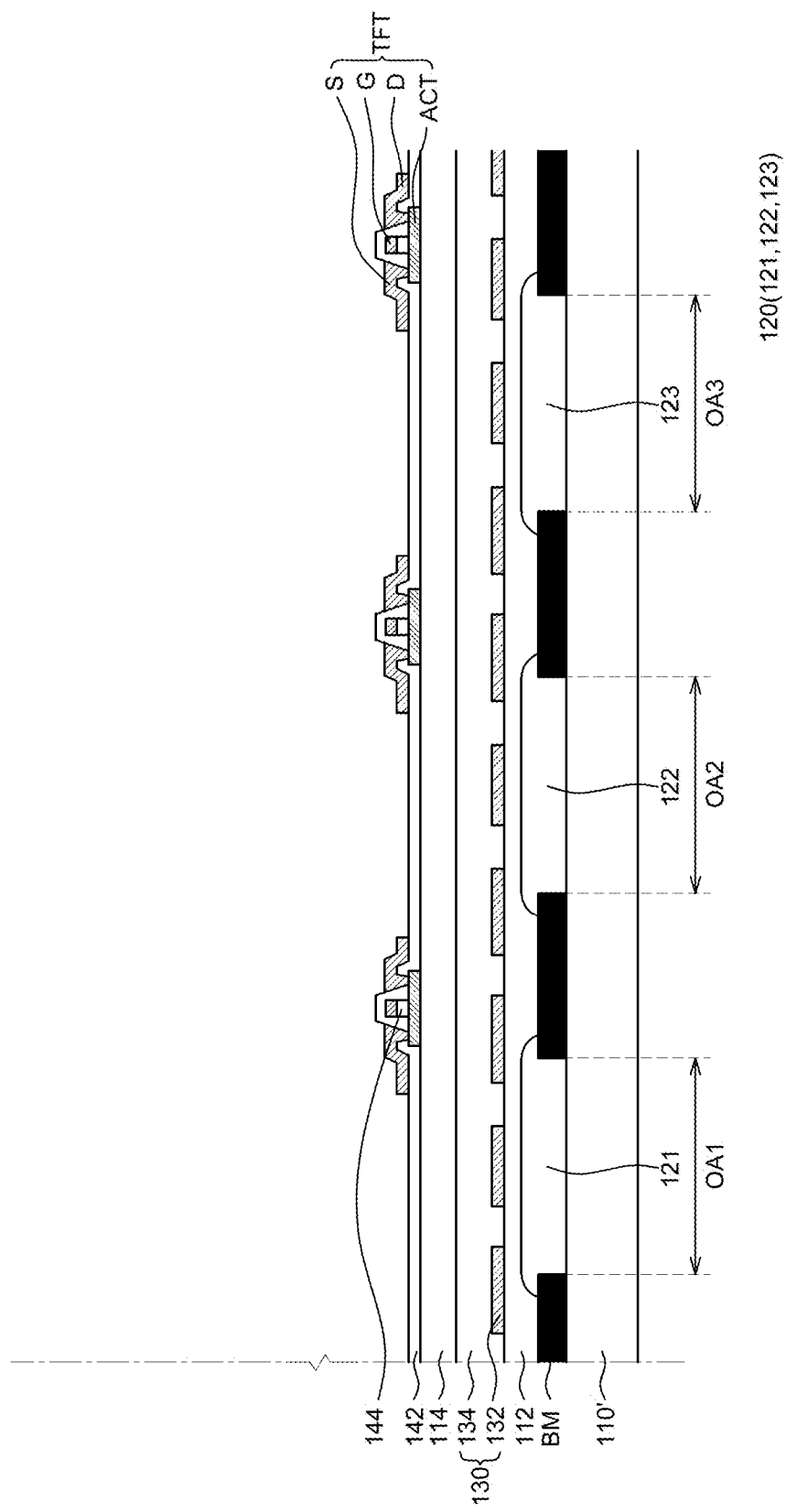

Referring to FIG. 3C, the first buffer layer 114 is formed on the entire surface of the touch sensor 130. The first buffer layer 114 may be formed of an inorganic material such as silicon nitride SiNx, silicon oxide SiOx, or aluminum oxide AlOx and deposited by a chemical vapor deposition (CVD) process or a plasma enhanced chemical vapor deposition (PECVD) process but is not limited thereto.

The thin film transistor TFT is formed on the first buffer layer 114.

First, the active layer ACT is disposed on the first buffer layer 114. In this case, the active layer ACT may be formed by a mask process. For example, the active layer ACT may be located in a designated area by a deposition process using a mask in which an area to be patterned is open. Alternatively, the active layer ACT may be formed by exposure, development, etching, and photosensitive resin removal processes through a photoresist doper and a patterning mask after depositing a semiconductor material on the entire surface of the first buffer layer 114.

The gate insulating layer 144 and the gate electrode G are formed by continuously depositing an insulating material and a gate metal material on the active layer ACT. Next, the interlayer insulating layer 142 is formed on an entire upper surface of the first buffer layer 114 on which the active layer ACT and the gate electrode G are formed. A contact hole is formed in the interlayer insulating layer 142 so as to expose a top surface of the active layer ACT. A metal material is applied and patterned on the interlayer insulating layer 142 to form the source electrode S and the drain electrode D so as to be in contact with the active layer ACT through a contact hole.

Figure 3D:
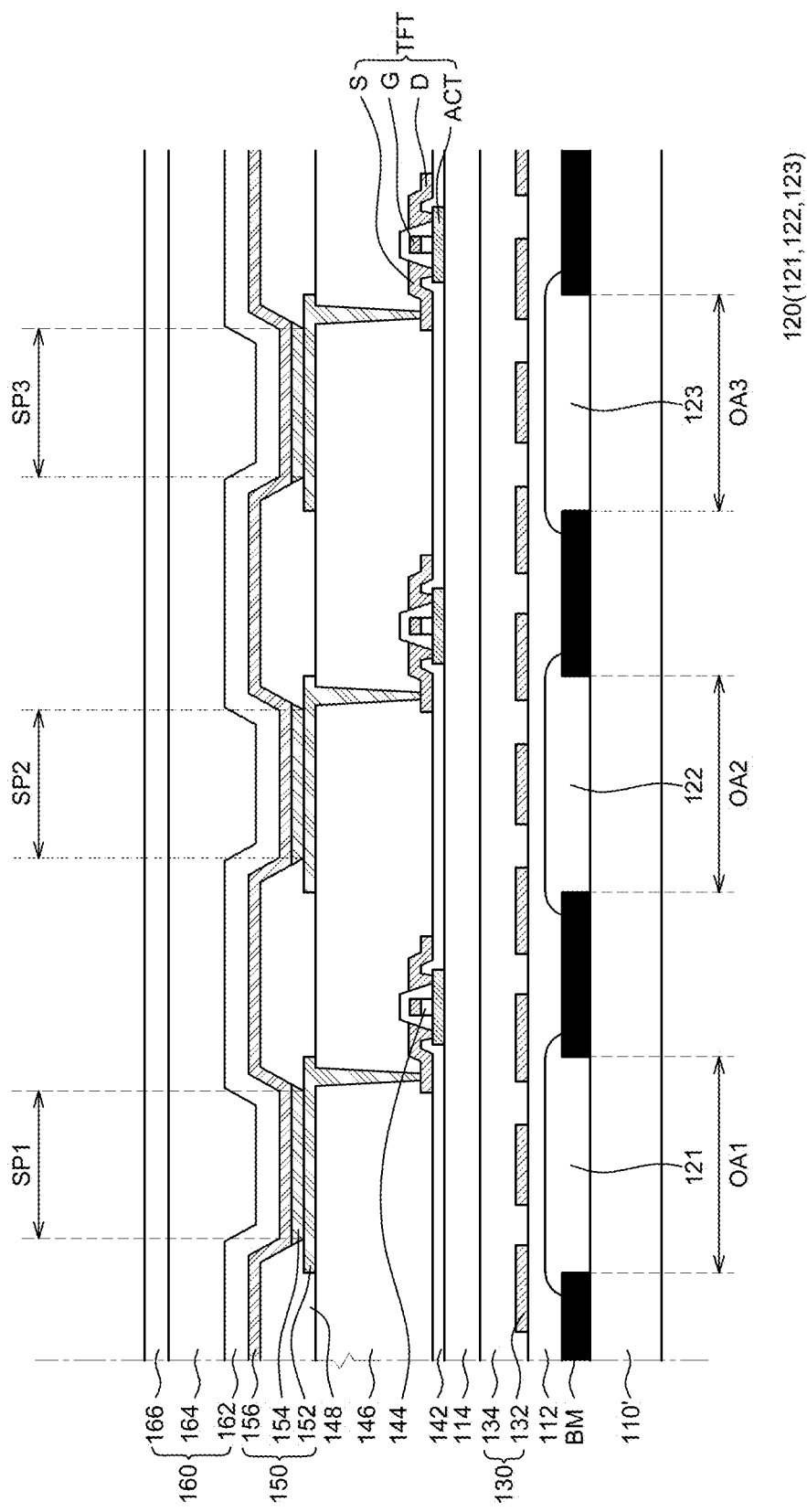

Referring to FIG. 3D, the planarization layer 146 is formed on an entire upper surface of the carrier glass substrate 110' on which the thin film transistor TFT is formed. In this case, a contact hole is formed in the planarization layer 146 to expose the source electrode S.

The organic light emitting element 150 is formed on the planarization layer 146. First, the anode 152 is formed to be electrically connected to the source electrode S disposed therebelow through a contact hole formed in the planarization layer 146. The anode 152 may be patterned by the mask process so as to be formed for every sub pixel.

The bank 148 is formed on the planarization layer 146. In this case, the bank 148 may be formed to cover an edge of the anode 152 to divide the emission area (sub pixel). In this case, the bank 148 may be patterned by a mask process. After forming the bank 148, the organic light emitting layer 154, the cathode 156, and the encapsulation layer 160 are sequentially formed.

Figure 3E:
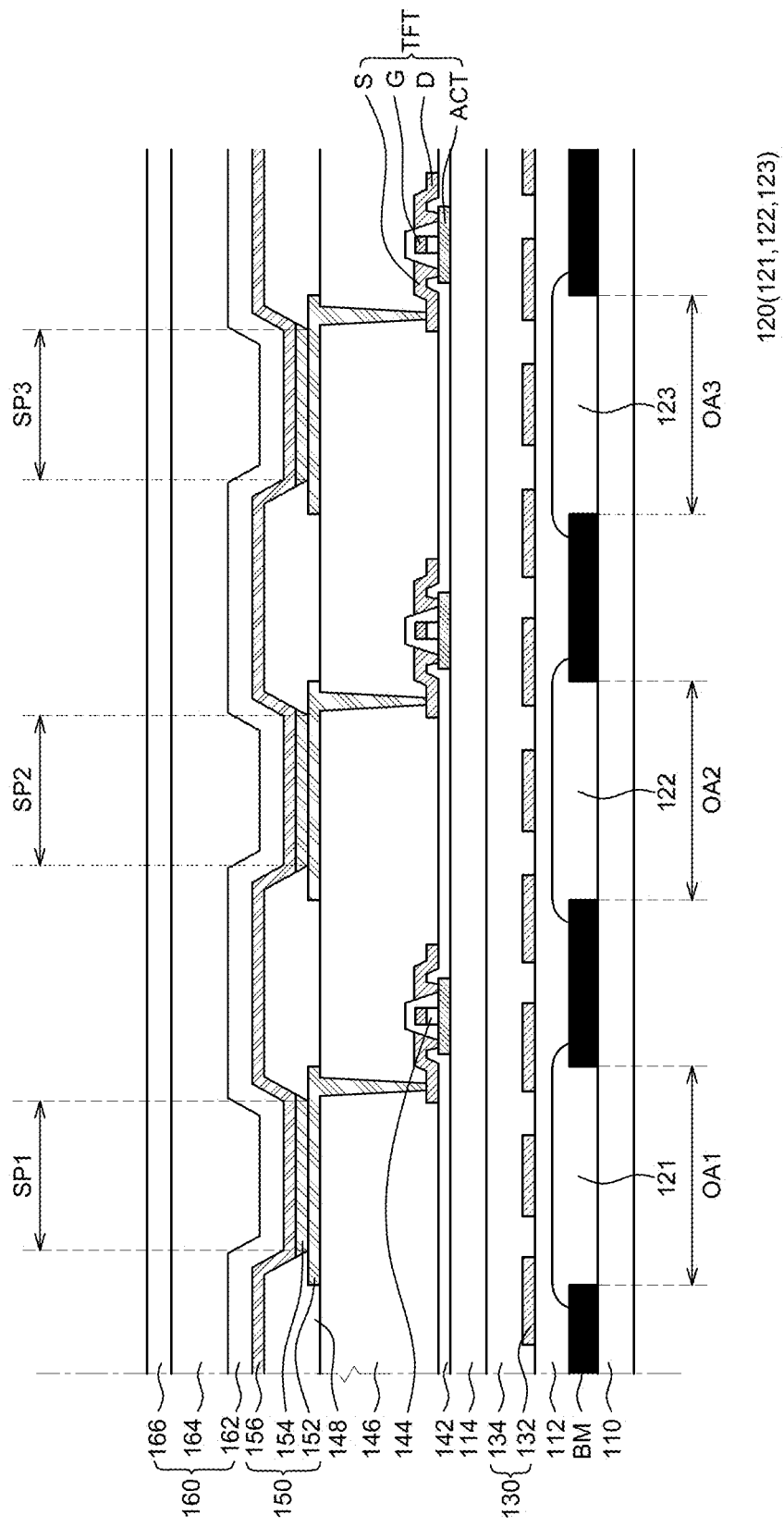

Referring to FIG. 3E, the carrier glass substrate 110' is etched. The thickness of the carrier glass substrate 110' is reduced by the etching process so that the carrier glass substrate 110' is used as a glass substrate 110 which protects an emission surface of the organic light emitting display device through which light emitted from the organic light emitting display element is emitted to the outside. Referring to FIG. 3A again, the carrier glass substrate 110' serves to support components during the manufacturing process of the organic light emitting display device. The carrier glass substrate 110' has a thickness enough to withstand the condition and the environment of the manufacturing process. However, in order to perform a function as a protective base member which protects the emission surface of the organic light emitting display device, the carrier glass substrate 110' needs to satisfy a sufficient transmittance. Further, since a lower surface of the carrier glass substrate 110' is damaged during the manufacturing process, the surface characteristic needs to be improved. Therefore, the surface of the carrier glass substrate 110' is etched to reduce the thickness and uniformize an outer surface. A thickness of the glass substrate 110 formed by etching the carrier glass substrate 110' may be 30 µm to 200 µm.

Even though not illustrated in FIG. 3E, after performing the process of etching the carrier glass substrate 110' to uniformize the thickness and the surface, a process of forming an opening pattern or a concave pattern in an area corresponding to a folding area or a bending area of the organic light emitting display device may be further added. For example, after forming a mask on the outer surface of the glass substrate 110 with a reduced thickness, a plurality of grooves which is formed to be inwardly concave from the outer surface of the glass substrate 110 may be formed by the etching process.

Figure 3F:
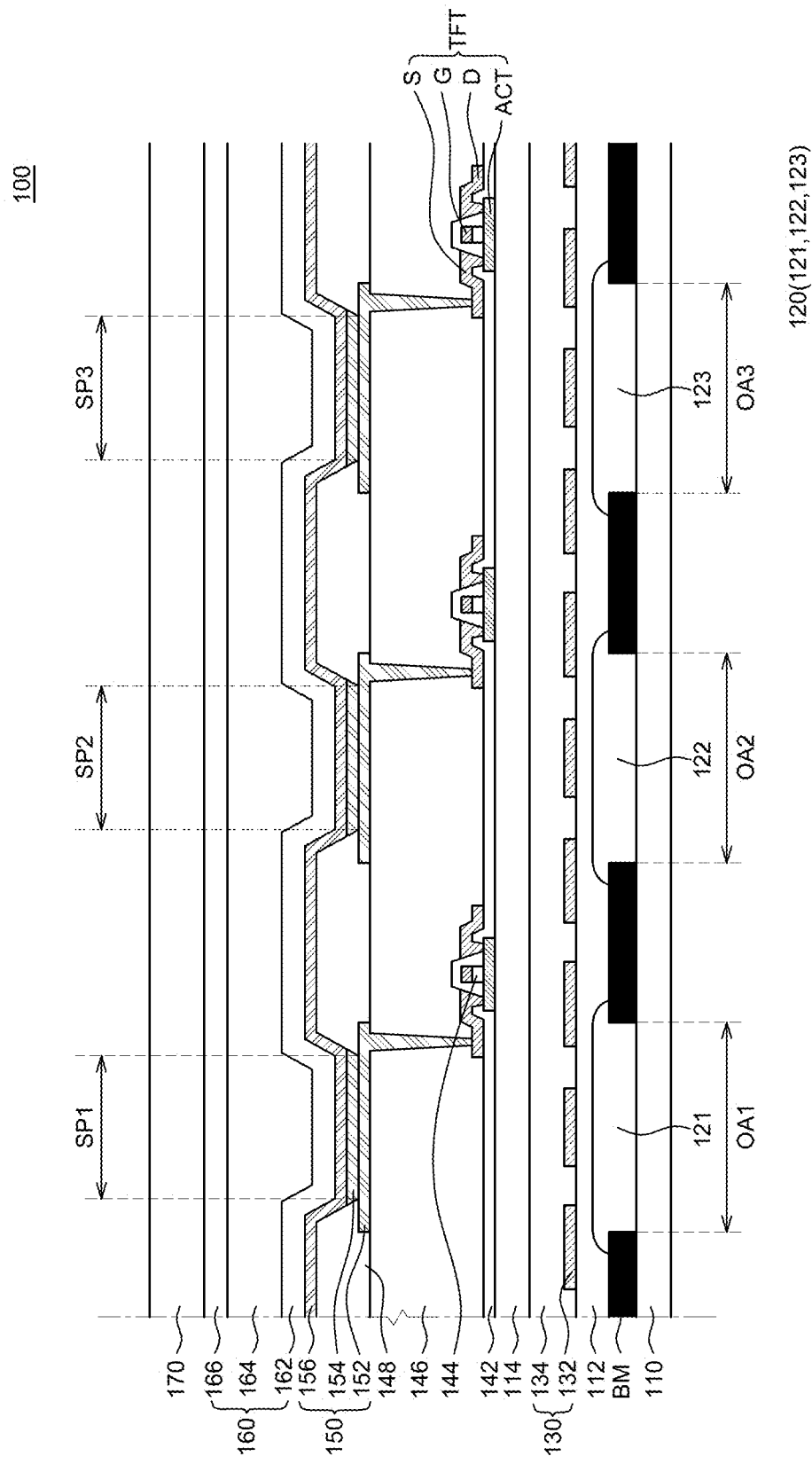

Referring to FIG. 3F, the cover base member 170 is formed on the encapsulation layer 160.

According to the manufacturing method of an organic light emitting display device according to an exemplary embodiment of the present disclosure, a bottom emission type organic light emitting display device with a structure in which an anti-reflection layer including a black matrix and a color filter, a touch sensor including a touch electrode, and an organic light emitting element are sequentially laminated on a glass substrate is manufactured. By doing this, a slim organic light emitting display device having an anti-reflection function and a touch sensing function may be manufactured.

In the meantime, the manufacturing method of an organic light emitting display device according to an exemplary embodiment of the present disclosure includes a process of forming the black matrix, the color filter, and the touch sensor on the glass substrate prior to the organic light emitting element. In order to form the black matrix, the color filter, and the touch sensor which have been described above in a top emission type organic light emitting display device, after forming the organic light emitting element first, an encapsulation layer, a black matrix, a color filter, and a touch sensor need to be formed above the organic light emitting element 150. However, the materials which configure the organic light emitting element are very vulnerable to the high temperature. Therefore, when the black matrix, the color filter, and the touch sensor which require a high temperature process are formed by a subsequent process to the organic light emitting element, the damage of the organic light emitting element is inevitable. Specifically, in order to locate the touch sensor above the organic light emitting element, the touch electrode which configures the touch sensor is advantageously formed of a transparent metal material which is transparent and has excellent transmittance such as indium tin oxide ITO or indium zinc oxide IZO at a high temperature. Therefore, according to the manufacturing method of an organic light emitting display device according to an exemplary embodiment of the present disclosure, the black matrix, the color filter, and the touch sensor which require a high temperature process are formed prior to the organic light emitting element and a bottom emission type organic light emitting display device is manufactured. Accordingly, an organic light emitting display device with a durability and a reliability which are significantly improved may be provided.

In the meantime, recently, in order to implement a flexible organic light emitting display device, a flexible material such as polyimide is used as a base member. However, the flexible material such as polyimide is vulnerable to external physical impacts. Further, in order to implement the base member with a flexible material having flexibility, a process of applying and processing the flexible material on a carrier substrate which is formed of glass is performed first. Thereafter, after forming the organic light emitting element, finally, a laser lift off (LLO) process for stripping off the base member formed of a flexible material from the carrier substrate needs to be additionally performed. Further, during the laser lift off process, there are problems in that the base member is cracked or a stripping failure occurs so that the base member is torn off together with the carrier substrate.

Therefore, the inventors of the present disclosure invented a method of utilizing the carrier glass substrate as a protective base member for protecting the emission surface of the organic light emitting display device. According to the manufacturing method of an organic light emitting display device according to an exemplary embodiment of the present disclosure, after sequentially forming a black matrix, a color filter, and an organic light emitting element on a carrier glass substrate, a process of etching an outer surface of the carrier glass substrate is performed. Accordingly, a bottom emission type organic light emitting display device in which the carrier glass substrate serves as a base member which supports the organic light emitting display device and also serves as a protective base member which protects the emission surface of the organic light emitting display device may be provided. Further, a thickness and a pattern of the carrier glass substrate are adjusted during the process of etching the carrier glass substrate to provide a bendable or foldable display device. By doing this, a process of forming a separate base member on the carrier substrate and a process of removing the base member from the carrier substrate are not necessary so that the overall process is more simplified, and the cost is also reduced.

Figure 4:
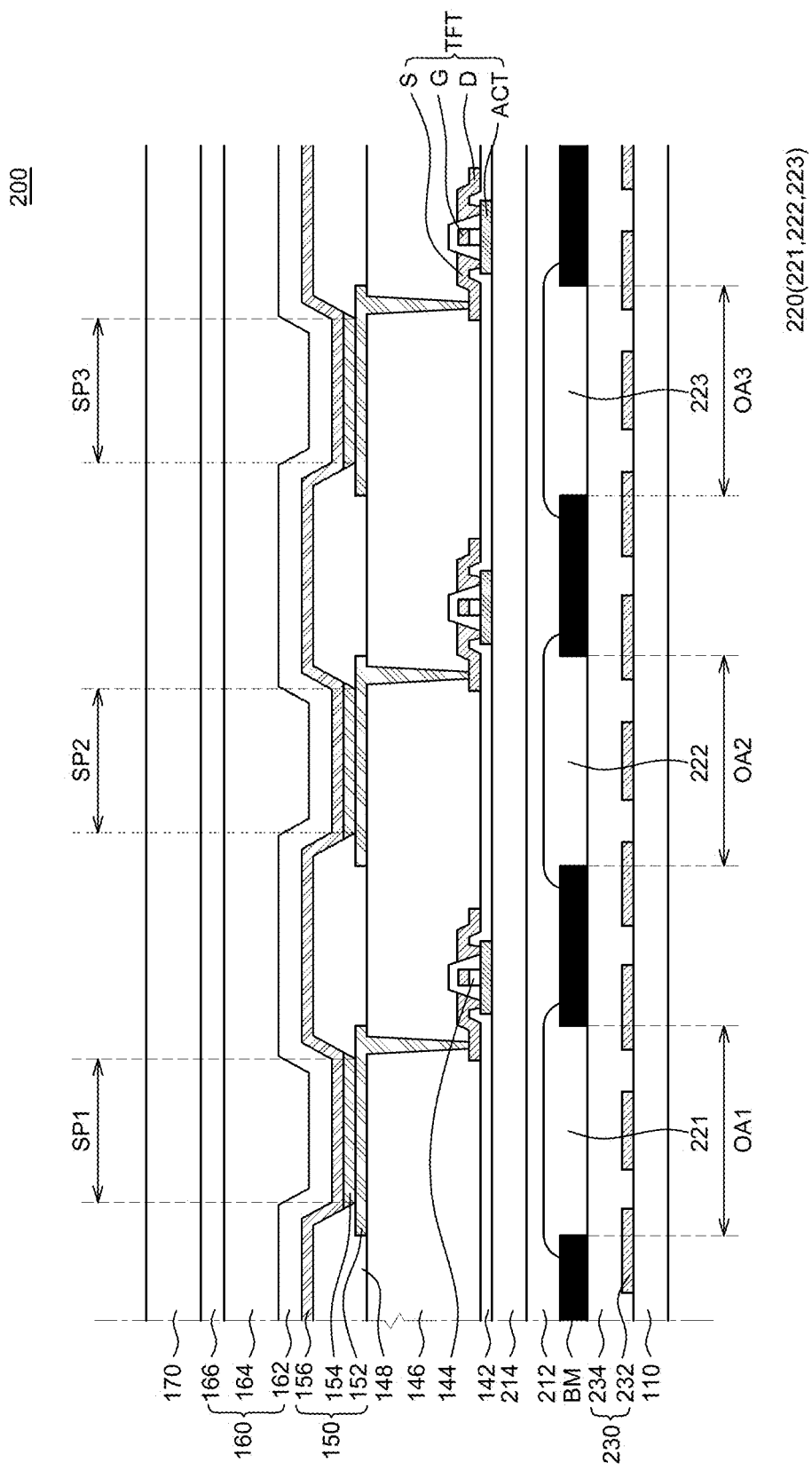
FIG. 4 is a schematic cross-sectional view of an organic light emitting display device according to another exemplary embodiment of the present disclosure.

FIG. 4 is a schematic cross-sectional view of an organic light emitting display device according to another exemplary embodiment of the present disclosure. As compared with the organic light emitting display device 100 illustrated in FIG. 2, other configurations are substantially the same except for positions of a black matrix BM, a plurality of color filters 220, and a touch sensor 230 of an organic light emitting display device 200 illustrated in FIG. 4. Therefore, a redundant description will be omitted.

Referring to FIG. 4, a touch sensor 230 is disposed on a glass substrate 110. The touch sensor 230 may be directly formed on a glass substrate 110 without using a separate adhesive member. Specifically, a touch electrode 232 of the touch sensor 230 may be directly formed on the glass substrate 110. Thereafter, a touch protection layer 234 may be formed on the touch electrode 232. A method of forming the touch sensor 230 on the glass substrate 110 is substantially the same as the method described with reference to FIG. 3B except that the touch electrode 232 is first formed on the glass substrate 110 rather than a second buffer layer 212. Therefore, a redundant description will be omitted.

Next, the black matrix BM and the plurality of color filters 220 are disposed on the touch sensor 230. The black matrix BM and the plurality of color filters 220 are formed on the same plane and are disposed on the touch protection layer 234 of the touch sensor 230 to be in direct contact with the touch protection layer. A method of forming the black matrix BM and the plurality of color filters 220 on the touch sensor 230 is substantially the same as the method described with reference to FIG. 3A except that the black matrix BM and the plurality of color filters 120 are first formed on the touch sensor 230 rather than the glass substrate 110. Therefore, a redundant description will be omitted.

A second buffer layer 212 is formed on the black matrix BM and the plurality of color filters 220. The second buffer layer 212 may protect or planarize the black matrix BM and the plurality of color filters 220. In the organic light emitting display device 200 illustrated in FIG. 4, the second buffer layer 212 is substantially the same as the second buffer layer 112 of the organic light emitting display device 100 illustrated in FIG. 2 except that the second buffer layer 212 is disposed between the black matrix BM and the plurality of color filters 220 and the first buffer layer 214.

The first buffer layer 214 is disposed on the second buffer layer 212. The second buffer layer 212 is disposed between the first buffer layer 214 and a thin film transistor TFT to protect the black matrix BM, the plurality of color filters 220, and the touch sensor 230 located therebelow. Further, the second buffer layer 212 protects the thin film transistor TFT from impurities and gas leaked from the black matrix BM, the plurality of color filters 220, and the touch sensor 230. In the organic light emitting display device 200 illustrated in FIG. 4, the first buffer layer 214 is substantially the same as the first buffer layer 114 of the organic light emitting display device 100 illustrated in FIG. 2 except that the first buffer layer 214 is disposed to be in contact with the second buffer layer 212.

In the meantime, in the organic light emitting display device according to another exemplary embodiment of the present disclosure, the second buffer layer 212 may be omitted. When the second buffer layer 212 is omitted, the first buffer layer 214 is disposed between the black matrix BM and the plurality of color filters 220 and the thin film transistor TFT to further perform a function of protecting or planarizing the black matrix BM and the plurality of color filters 220.

The organic light emitting display device 200 according to another exemplary embodiment of the present disclosure has a structural characteristic in that the touch sensor 230 is disposed on the glass substrate 110 to be in direct contact with the glass substrate 110 and the black matrix BM and the plurality of color filters 220 are disposed on the touch sensor 230 to be closer to the organic light emitting element 150. The touch sensor 230 is directly formed on the glass substrate 110 so that a touch input of the user may be more accurately sensed. Further, the black matrix and the plurality of color filters 220 are disposed between the touch sensor 230 and the organic light emitting element 150 so that a distance between the touch sensor 230 and the organic light emitting element 150 is increased. By doing this, a parasitic capacitance caused between the touch electrode 232 of the touch sensor 230 and the organic light emitting element 150 and an electrode and a wiring line formed therearound may be minimized, which results in the improvement of a touch sensitivity.

As compared with the organic light emitting display device 100 illustrated in FIG. 2, in the organic light emitting display device 200 illustrated in FIG. 4, the black matrix BM is disposed on the touch sensor 230 to be closer to the organic light emitting element 150. By doing this, an angle of light downwardly emitted from the organic light emitting element 150 may be widened. That is, the organic light emitting display device according to another exemplary embodiment of the present disclosure may provide a bottom emission type display device with a wide viewing angle.

Figure 5:
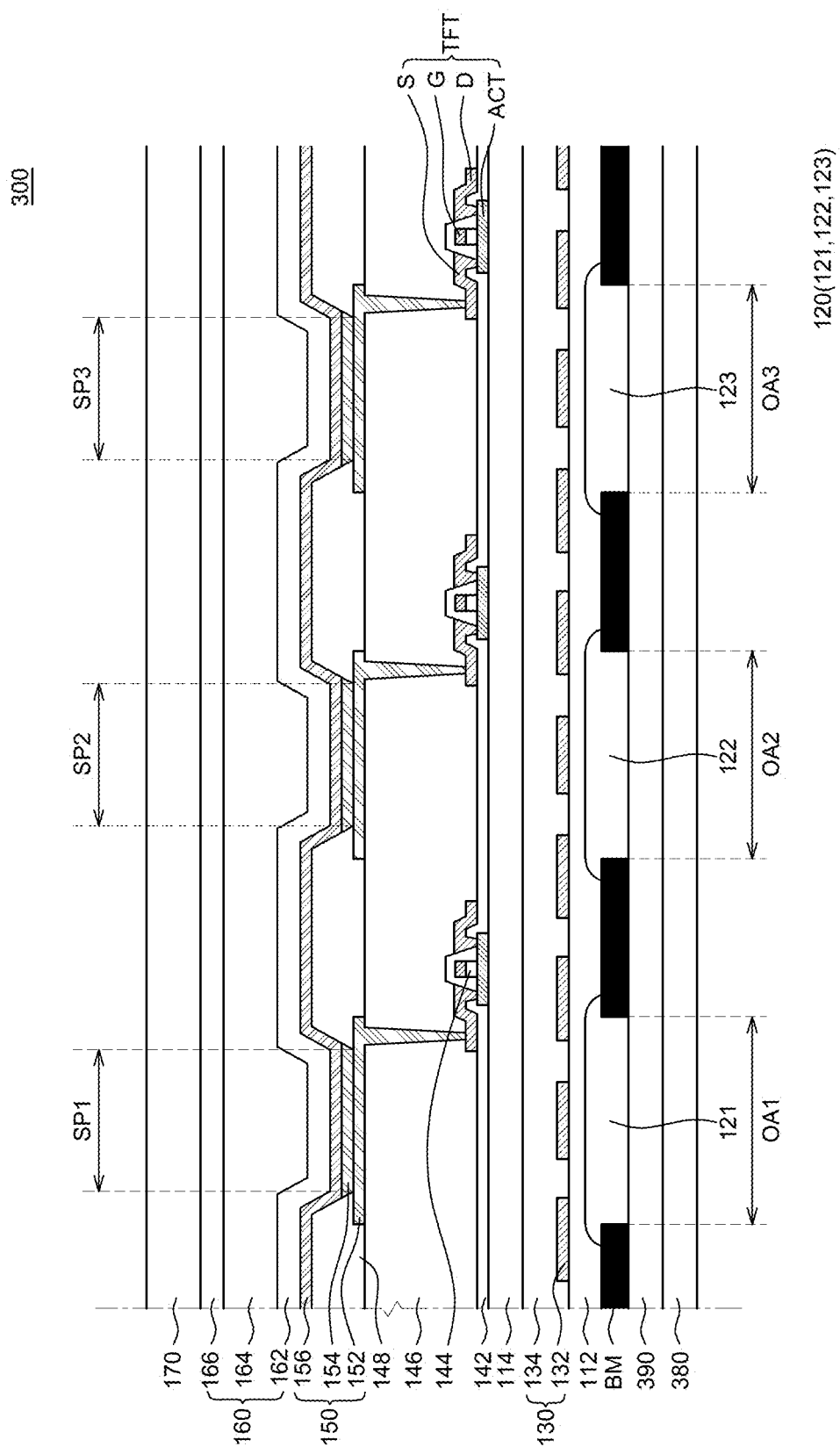
FIG. 5 is a schematic cross-sectional view of an organic light emitting display device according to still another exemplary embodiment of the present disclosure.

FIG. 5 is a schematic cross-sectional view of an organic light emitting display device according to still another exemplary embodiment of the present disclosure. As compared with the organic light emitting display device 100 illustrated in FIG. 2, other components are substantially the same except that in an organic light emitting display device 300 illustrated in FIG. 5, a transparent flexible film 390 and a transparent protective film 380 are used instead of the glass substrate. Therefore, a redundant description will be omitted.

Referring to FIG. 5, an organic light emitting display device 300 includes a transparent protective film 380, a transparent flexible film 390, a black matrix BM, a plurality of color filters 120, a touch sensor 130, an organic light emitting element 150, and an encapsulation layer 160.

The transparent flexible film 390 is a substrate which supports and protects several components of the organic light emitting display device 300. The organic light emitting display device 300 according to the exemplary embodiment of the present disclosure is a bottom emission type so that in order to cause the light to be directed downwardly, the transparent flexible film 390 may be formed of an insulating polymer material having transparency. For example, the transparent flexible film 390 may be selected from polyimide, polyethersulfone, polyethylene terephthalate, and polycarbonate.

The transparent protective film 380 is disposed below the transparent flexible film 390. The transparent protective film 380 supports the transparent flexible film 390 and protects an emission surface of the organic light emitting display device 300. The transparent protective film 380 may be formed of an insulating polymer material having transparency to cause the light to downwardly travel. For example, the transparent protective film 380 may be formed of a thin plastic film configured by a combination of polyimide, polyethersulfone, polyethylene terephthalate, polycarbonate, and other suitable polymers.

The organic light emitting display device 300 according to another exemplary embodiment of the present disclosure includes a transparent protective film 380 and a transparent flexible film 390 which are transparent and flexible, rather than the glass substrate 110. Therefore, various designs may be implemented with a smaller radius of curvature.

FIGS. 6A to 6G are cross-sectional views for explaining a manufacturing method of an organic light emitting display device according to another exemplary embodiment of the present disclosure. As compared with the manufacturing method of an organic light emitting display device illustrated in FIGS. 3A to 3F, other configurations are substantially the same except that in a manufacturing method of an organic light emitting display device illustrated in FIGS. 6A to 6G, a transparent flexible film 390 and a transparent protective film 380 are used and a process thereby is different. Therefore, a redundant description will be omitted.

Referring to FIG. 6A, a transparent flexible film 390 is formed on a carrier glass substrate 310'. In this case, the carrier glass substrate 310' is substantially the same as described in FIG. 3A so that a redundant description will be omitted.

Specifically, after coating a transparent polymer material on the carrier glass substrate 310', a film is formed. For example, the transparent polymer material may be selected from polyimide, polyethersulfone, polyethylene terephthalate, and polycarbonate. The transparent polymer material is coated on the carrier glass substrate 310' using a spin coating method, a roll coating method, or a slit coating method and then a film is formed to form a transparent flexible film 390.

In the meantime, in order to easily separate the carrier glass substrate 310' and the transparent flexible film 390, which will be described below with reference to FIG. 6F, before coating the transparent polymer material on the carrier glass substrate 310', a sacrificial layer may be formed on the carrier glass substrate 310' first.

Referring to FIG. 6B, a black matrix BM and a plurality of color filters 120 are formed on the transparent flexible film 390. A method of forming the black matrix BM and the plurality of color filters 120 is substantially the same as the method described in FIG. 3A except that the black matrix and the plurality of color filters are formed on the transparent flexible film 390, rather than the carrier glass substrate 310'. Therefore, a redundant description will be omitted. Next, a second buffer layer 112 is formed on the entire surface of the carrier glass substrate 310' on which the black matrix BM and the plurality of color filters 120 are completed.

Figure 6C:
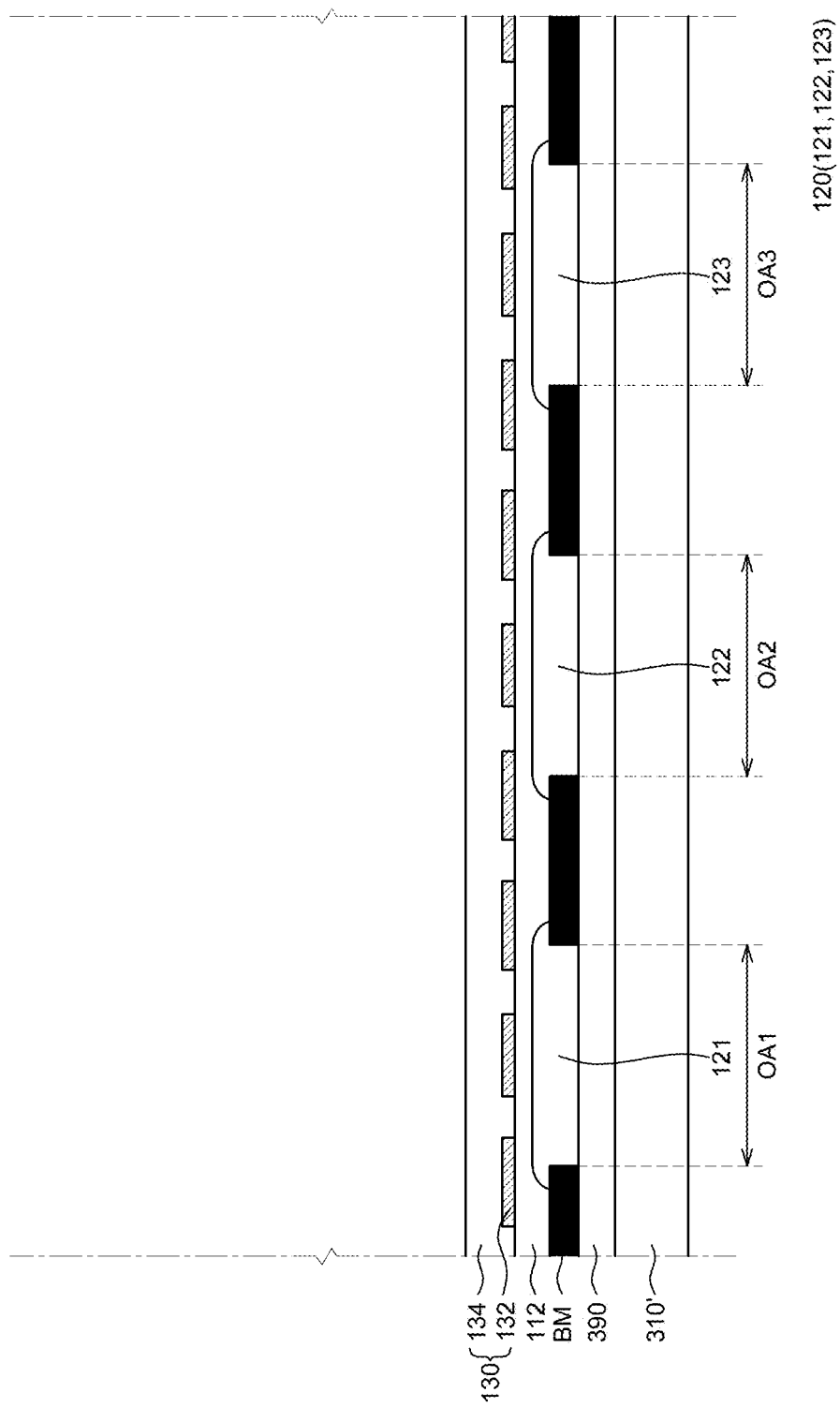

Referring to FIG. 6C, a touch sensor 130 is formed on the second buffer layer 112. The method of forming the touch sensor 130 on the second buffer layer 112 is substantially the same as the method described in FIG. 3B so that a redundant description will be omitted.

Figure 6D:
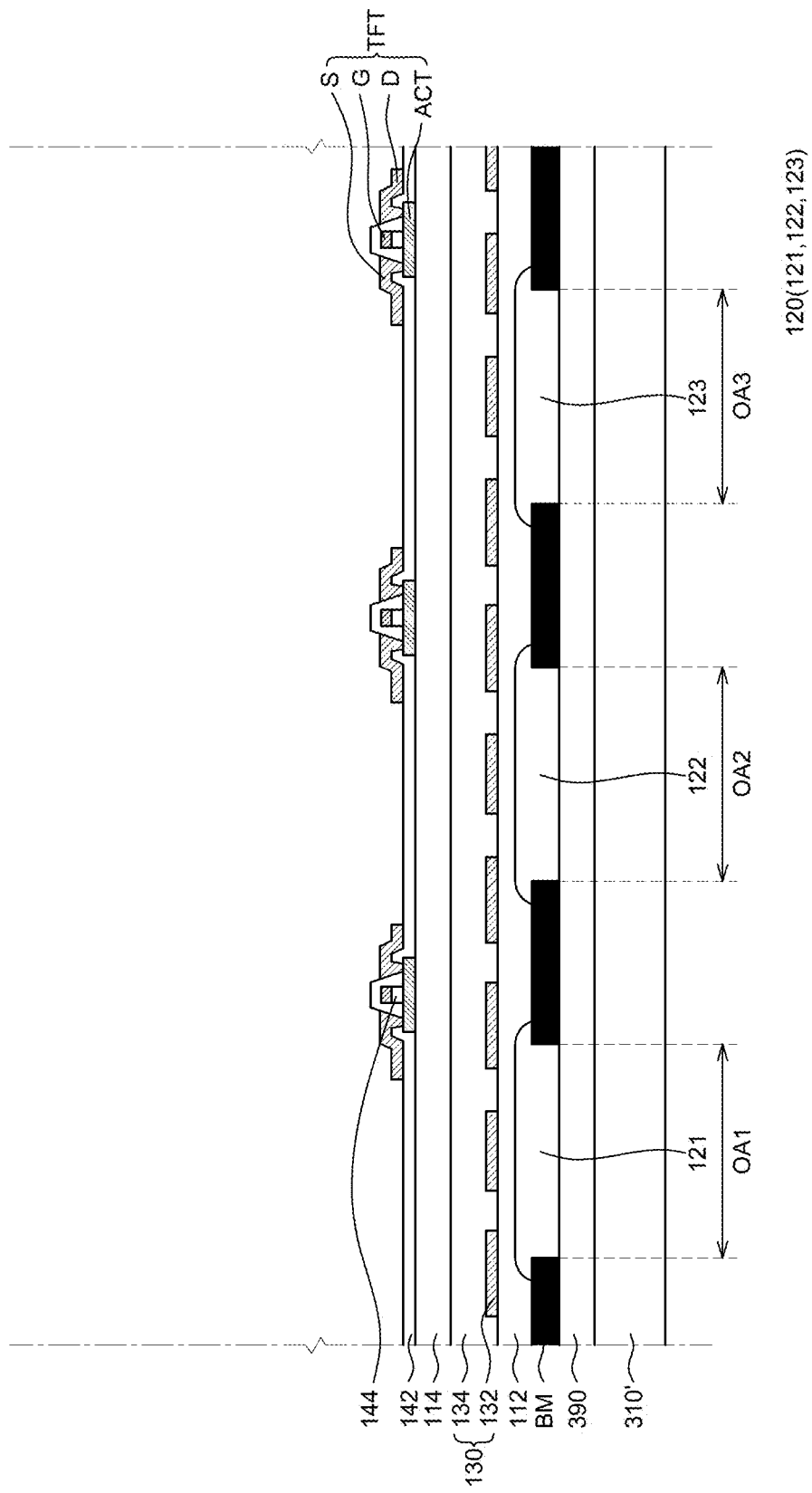

Referring to FIG. 6D, a first buffer layer 114 is formed on the entire surface of the touch sensor 130 and a thin film transistor TFT is formed on the first buffer layer 114. The method of forming the first buffer layer 114 and the thin film transistor TFT is substantially the same as the method described in FIG. 3C so that a redundant description will be omitted.

Figure 6E:
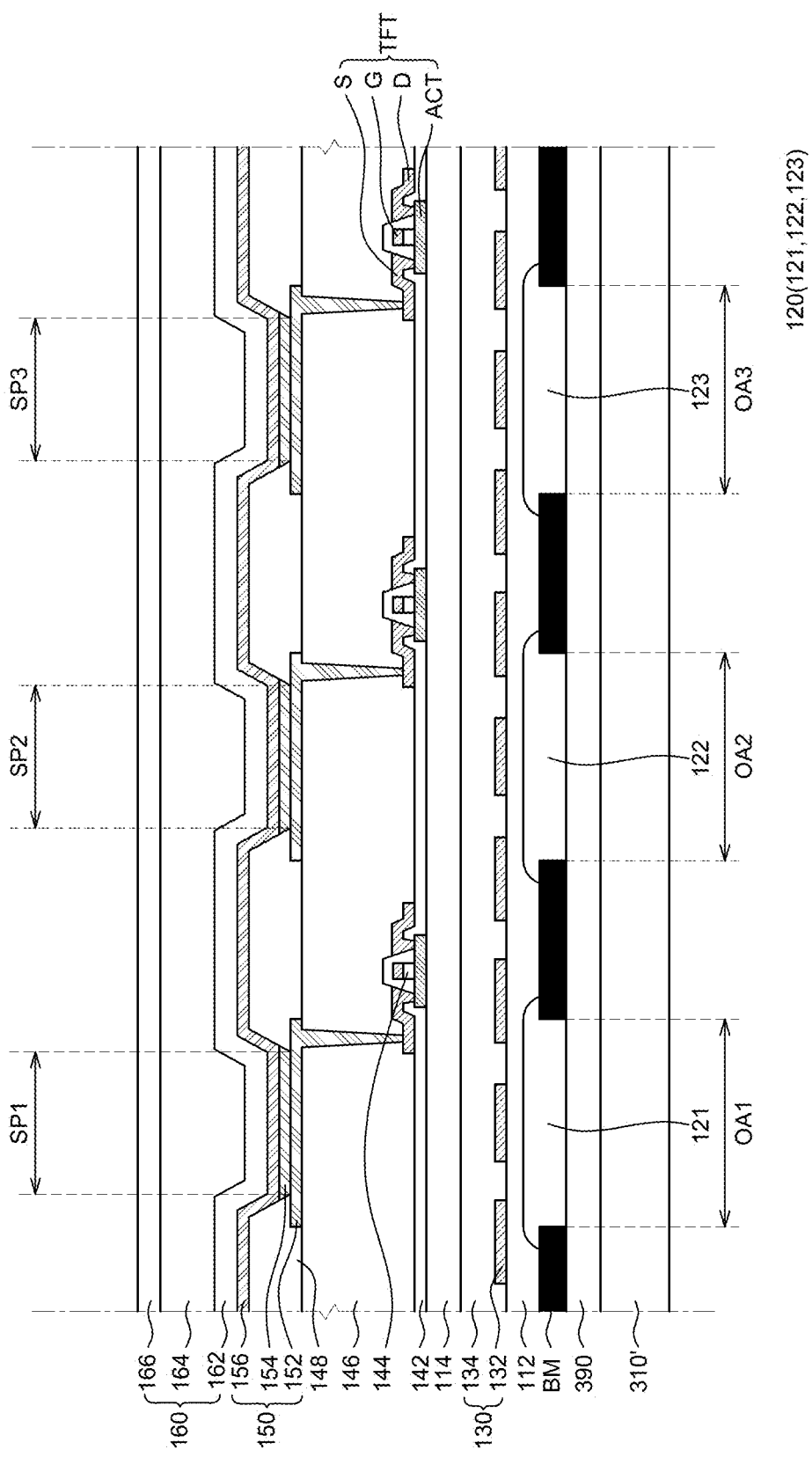

Referring to FIG. 6E, a planarization layer 146 is formed on an entire upper surface of the carrier glass substrate 310' on which the thin film transistor TFT is formed and an organic light emitting element 150 and an encapsulation layer 160 are formed on the planarization layer 146. The method of forming the planarization layer 146, the organic light emitting element 150, and the encapsulation layer 160 is substantially the same as the method described in FIG. 3D so that a redundant description will be omitted.

Figure 6F:
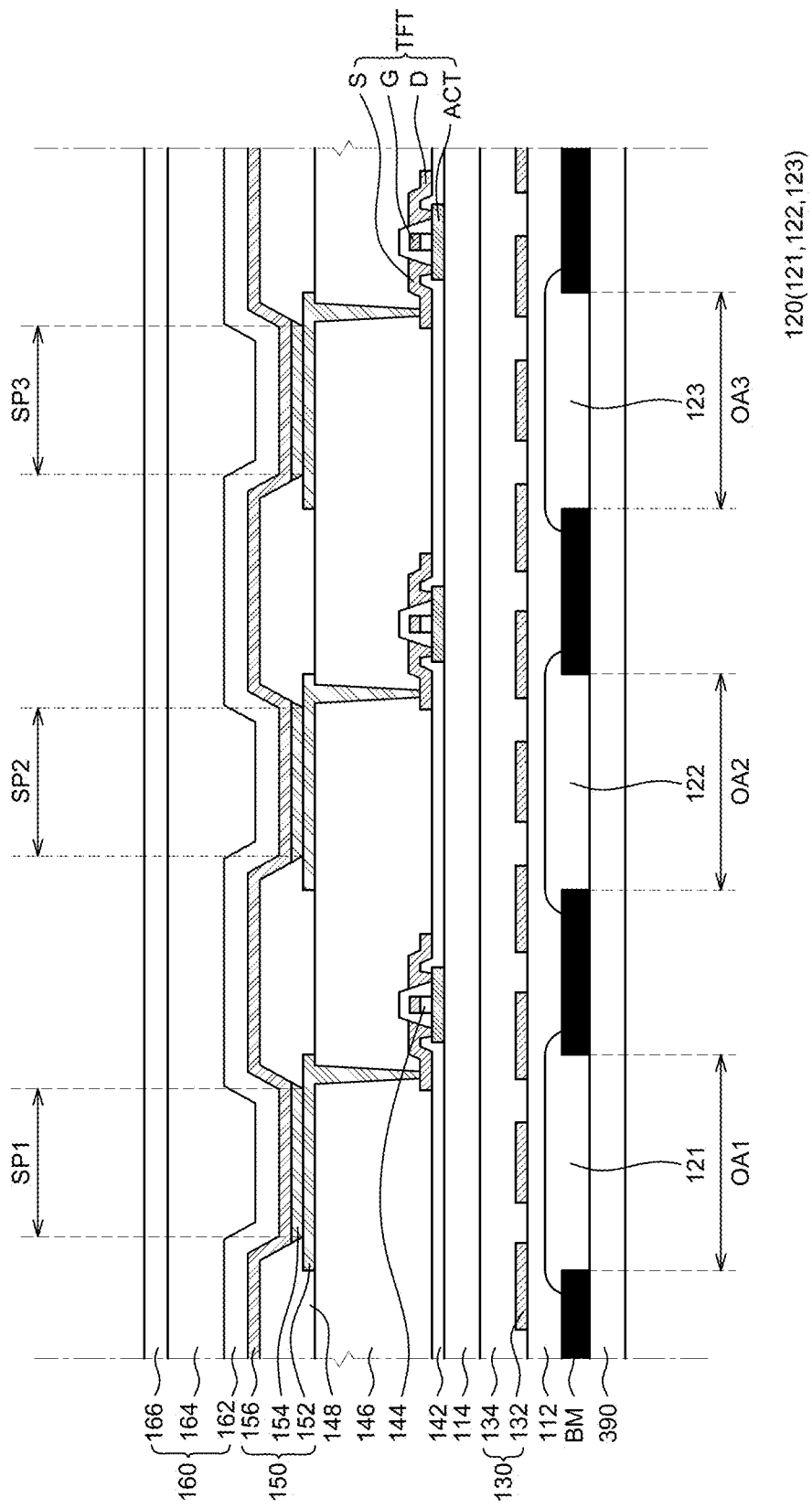

Referring to FIG. 6F, the carrier glass substrate 310' is stripped off. For example, the carrier glass substrate 310' and the transparent flexible film 390 may be separated by a laser lift off (LLO) process. Specifically, a sacrificial layer which is formed of amorphous silicon is disposed between the carrier glass substrate 310' and the transparent flexible film 390, the laser is irradiated onto the carrier glass substrate 310'. The laser which is irradiated on carrier glass substrate 310' induces reaction of a-Si:H and the carrier glass substrate 310' and the transparent flexible film 390 may be separated from each other by hydrogen H generated in the reaction.

Figure 6G:
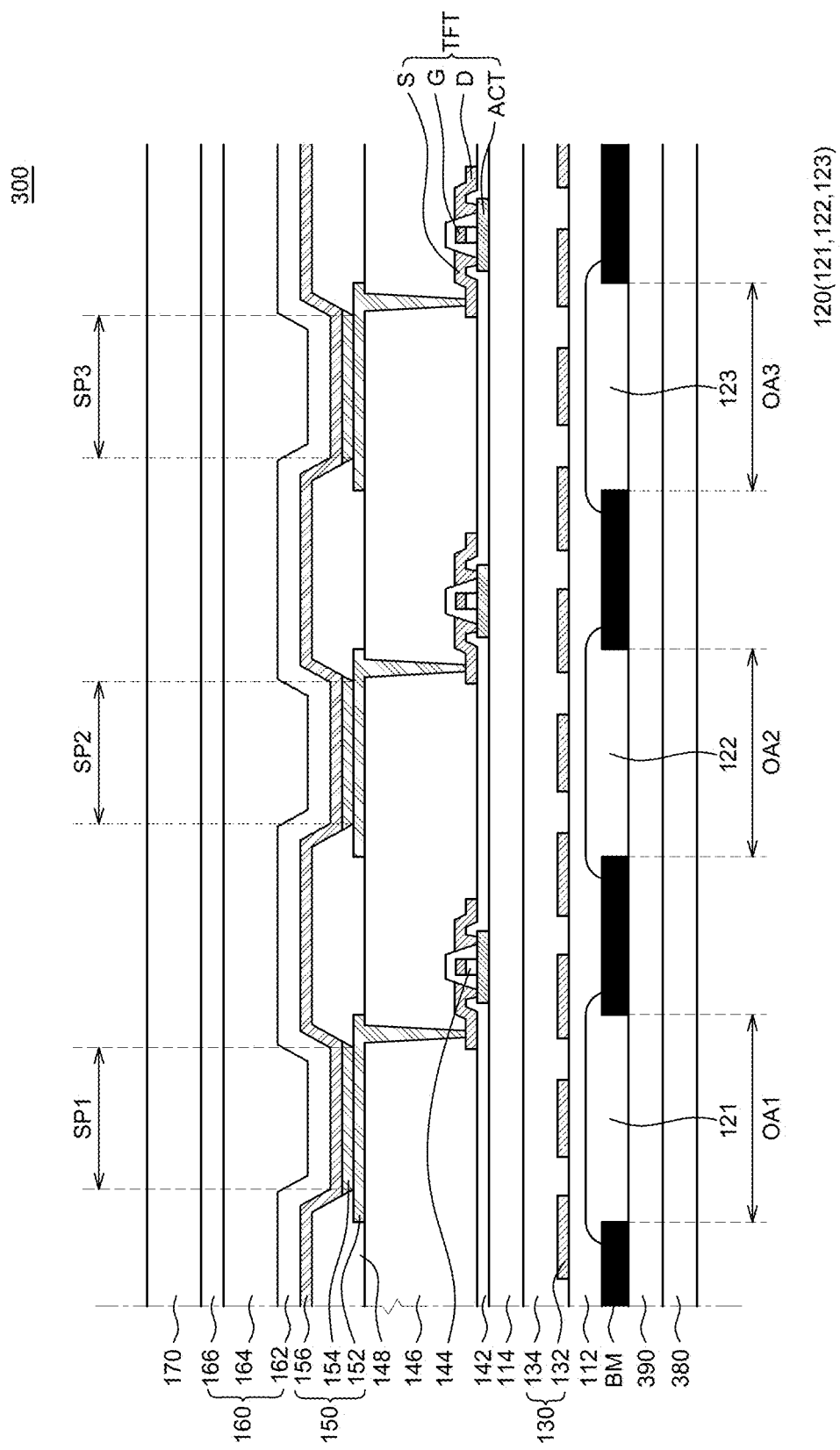

Referring to FIG. 6G, a transparent protective film 380 is formed below the transparent flexible film 390 and a cover base member 170 is formed above the encapsulation layer 160.

The exemplary embodiments of the present disclosure can also be described as follows:

According to an aspect of the present disclosure, there is provided an organic light emitting display device. The organic light emitting display device comprises a transparent base member, a touch sensor which includes a touch electrode disposed above the transparent base member and a touch protection layer which covers the touch electrode, a black matrix which is disposed below or above the touch sensor and defines a plurality of opening areas, a plurality of color filters which is disposed on the same plane as the black matrix and corresponds to the plurality of opening areas, a first buffer layer disposed above the upper one of the touch sensor and the plurality of color filters, a thin film transistor disposed above the first buffer layer, and an organic light emitting element which is disposed above the thin film transistor and corresponds to the plurality of opening areas.

The first buffer layer may be a single layer or multi layer selected from a group consisting of silicon nitride SiNx, silicon oxide SiOx, and aluminum oxide AlOx.

The black matrix and the plurality of color filters may be disposed below the touch sensor, the first buffer layer may be disposed on the touch sensor, and a second buffer layer disposed between the plurality of color filters and the touch sensor to planarize an upper portion of the plurality of color filters may be further provided.

The second buffer layer may be formed of an inorganic material having a barrier property.

The touch electrode may be disposed on the second buffer layer to be in direct contact with the second buffer layer.

The black matrix and the plurality of color filters may be disposed on the touch sensor.

The second buffer layer disposed on the plurality of color filters to planarize an upper portion of the plurality of color filters may be further provided, and the first buffer layer may be disposed between the second buffer layer and the thin film transistor.

The black matrix may be disposed on the touch protection layer to be in direct contact with the touch protection layer.

The organic light emitting display device further comprises an encapsulation layer disposed on the organic light emitting element, and a cover base member disposed on the encapsulation layer.

The transparent base member may be a glass substrate.

A thickness of the glass substrate may be 30 μm to 200 μm.

The glass substrate may include an inner surface which faces the organic light emitting element and an outer surface which is opposite to the inner surface and the glass substrate includes an opening pattern or a concave pattern which is inwardly formed from the outer surface to allow the organic light emitting display device to be foldable or bendable.

Any one of the black matrix and the touch electrode may be disposed on the glass substrate to be in direct contact with the glass substrate.

The transparent base member may be a transparent flexible film formed of polyimide and a transparent protective film which is attached to a lower portion of the transparent flexible film may be further provided.

The organic light emitting display device may be a bottom emission type in which light emitted from the organic light emitting element is emitted to the transparent base member.

According to another aspect of the present disclosure, there is provided a manufacturing method of an organic light emitting display device. The manufacturing method comprises forming a black matrix, a plurality of color filters, and a touch sensor above a carrier glass substrate, forming a first buffer layer above the plurality of color filters and the touch sensor, forming a thin film transistor above the first buffer layer, forming a planarization layer to cover the thin film transistor, forming an organic light emitting element including an anode, an organic light emitting layer, and a cathode above the planarization layer, and forming an encapsulation layer above the organic light emitting element.

The forming of a black matrix, a plurality of color filters, and a touch sensor may include forming the black matrix on the carrier glass substrate to define a plurality of opening areas, forming the plurality of color filters to fill the plurality of opening areas, forming a second buffer layer on an entire upper surface of the plurality of color filters, and forming a touch electrode on the second buffer layer and forming a touch protection layer to cover an entire upper surface of the touch electrode.

The forming of a black matrix, a plurality of color filters, and a touch sensor may include forming a touch electrode on the carrier glass substrate and forming a touch protection layer to cover an entire upper surface of the touch electrode, forming the black matrix on the touch protection layer to define a plurality of opening areas, and forming the plurality of color filters to fill the plurality of opening areas.

The forming of a black matrix, a plurality of color filters, and a touch sensor may include forming a second buffer layer on an entire upper surface of the plurality of color filters.

The manufacturing method may further comprise forming an encapsulation layer on the organic light emitting element, and etching a lower surface of the carrier glass substrate to reduce a thickness of the carrier glass substrate after forming the encapsulation layer.

The thickness of the carrier glass substrate may be reduced from 400 μm to 800 μm to 30 μm to 200 μm after the etching by the etching of a bottom surface of the carrier glass substrate.

The manufacturing method may further comprise forming an opening pattern or a concave pattern which is formed to be inwardly concave from the lower surface of the carrier glass substrate.

The manufacturing method may further comprise forming a transparent flexible film by coating polyimide on the carrier glass substrate, stripping off the carrier glass substrate after forming the encapsulation layer, and placing a transparent protective film on a bottom surface of the transparent flexible film.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
a transparent base member;
a touch sensor which includes a touch electrode disposed above the transparent base member and a touch protection layer which covers the touch electrode;
a black matrix which is disposed below or above the touch sensor and defines a plurality of opening areas;
a plurality of color filters which is disposed on the same plane as the black matrix and corresponds to the plurality of opening areas;
a first buffer layer disposed above the upper one of the touch sensor and the plurality of color filters;
a thin film transistor disposed above the first buffer layer;
an organic light emitting element which is disposed above the thin film transistor and corresponds to the plurality of opening areas; and a second buffer layer disposed between the first buffer layer and the plurality of color filters and above the plurality of color filters to planarize a portion of the plurality of color filters,
wherein the second buffer layer is formed of an inorganic material having a barrier property.

2. The organic light emitting display device according to claim 1, wherein the first buffer layer is a single layer or multi layer selected from a group consisting of silicon nitride SiNx, silicon oxide SiOx, and aluminum oxide AlOx.

3. The organic light emitting display device according to claim 1, wherein the black matrix and the plurality of color filters are disposed below the touch sensor, the first buffer layer is disposed on the touch sensor, and
the second buffer layer is disposed between the plurality of color filters and the touch sensor to planarize an upper portion of the plurality of color filters is further provided.

4. The organic light emitting display device according to claim 3, wherein the touch electrode is disposed on the second buffer layer to be in direct contact with the second buffer layer.

5. The organic light emitting display device according to claim 1, wherein the black matrix and the plurality of color filters are disposed on the touch sensor.

6. The organic light emitting display device according to claim 5, wherein the second buffer layer is disposed on the plurality of color filters to planarize an upper portion of the plurality of color filters, and
the first buffer layer is disposed between the second buffer layer and the thin film transistor.

7. The organic light emitting display device according to claim 5, wherein the black matrix is disposed on the touch protection layer to be in direct contact with the touch protection layer.

8. The organic light emitting display device according to claim 1, further comprising:
an encapsulation layer disposed on the organic light emitting element; and
a cover base member disposed on the encapsulation layer.

9. The organic light emitting display device according to claim 1, wherein the transparent base member is a glass substrate.

10. The organic light emitting display device according to claim 9, wherein a thickness of the glass substrate is 30 μm to 200 μm.

11. The organic light emitting display device according to claim 10, wherein the glass substrate includes an inner surface which faces the organic light emitting element and an outer surface which is opposite to the inner surface, and
the glass substrate includes an opening pattern or a concave pattern which is inwardly formed from the outer surface to allow the organic light emitting display device to be foldable or bendable.

12. The organic light emitting display device according to claim 9, wherein any one of the black matrix and the touch electrode is disposed on the glass substrate to be in direct contact with the glass substrate.

13. The organic light emitting display device according to claim 1, wherein the transparent base member is a transparent flexible film formed of polyimide, and a transparent protective film which is attached to a lower portion of the transparent flexible film is further provided.

14. The organic light emitting display device according to claim 1, wherein the organic light emitting display device is a bottom emission type in which light emitted from the organic light emitting element is emitted to the transparent base member.

15. A manufacturing method of an organic light emitting display device, the manufacturing method comprising:
   forming a black matrix, a plurality of color filters, and a touch sensor above a carrier glass substrate;
   forming a first buffer layer above the plurality of color filters and the touch sensor;
   forming a thin film transistor above the first buffer layer;
   forming a planarization layer to cover the thin film transistor;
   forming an organic light emitting element including an anode, an organic light emitting layer, and a cathode above the planarization layer; and
   forming an encapsulation layer above the organic light emitting element; and
   etching a surface of the carrier glass substrate to reduce a thickness of the carrier glass substrate.

16. The manufacturing method according to claim 15, wherein the forming of the black matrix, the plurality of color filters, and the touch sensor includes:
   forming the black matrix on the carrier glass substrate to define a plurality of opening areas;
   forming the plurality of color filters to fill the plurality of opening areas;
   forming a second buffer layer on an entire upper surface of the plurality of color filters; and
   forming a touch electrode on the second buffer layer and forming a touch protection layer to cover an entire upper surface of the touch electrode.

17. The manufacturing method according to claim 15, wherein the forming of the black matrix, the plurality of color filters, and the touch sensor includes:
   forming a touch electrode on the carrier glass substrate and forming a touch protection layer to cover an entire upper surface of the touch electrode;
   forming the black matrix on the touch protection layer to define a plurality of opening areas; and
   forming the plurality of color filters to fill the plurality of opening areas.

18. The manufacturing method according to claim 15, wherein the forming of the black matrix, the plurality of color filters, and the touch sensor further includes:
   forming a second buffer layer on an entire upper surface of the plurality of color filters.

19. The manufacturing method according to claim 15, wherein:
   the encapsulation layer is formed on the organic light emitting element; and
   the etching comprises etching a lower surface of the carrier glass substrate to reduce the thickness of the carrier glass substrate after forming the encapsulation layer.

20. The manufacturing method according to claim 19, wherein the thickness of the carrier glass substrate is reduced from 400 μm to 800 μm to 30 μm to 200 μm after the etching of the lower surface by etching a bottom surface of the carrier glass substrate.

21. The manufacturing method according to claim 19, further comprising:
   forming an opening pattern or a concave pattern which is formed to be inwardly concave from the lower surface of the carrier glass substrate.

22. A manufacturing method of an organic light emitting display device, the manufacturing method comprising:
   forming a black matrix, a plurality of color filters, and a touch sensor above a substrate;
   forming a first buffer layer above the plurality of color filters and the touch sensor;
   forming a thin film transistor above the first buffer layer;
   forming a planarization layer to cover the thin film transistor;
   forming an organic light emitting element including an anode, an organic light emitting layer, and a cathode above the planarization layer;
   forming an encapsulation layer above the organic light emitting element;
   forming a transparent flexible film on the substrate;
   stripping off the substrate; and
   placing a transparent film on a surface of the transparent flexible film.

23. The manufacturing method according to claim 22, wherein:
   the substrate is a carrier glass substrate;
   the transparent flexible film comprises polyimide;
   the transparent film is a transparent protective film;
   the stripping is performed after forming the encapsulation layer; and
   the transparent protective film is placed on a bottom surface of the transparent flexible film.

24. An organic light emitting display device, comprising:
   a transparent base member;
   a touch sensor which includes a touch electrode disposed above the transparent base member and a touch protection layer which covers the touch electrode;
   a black matrix which is disposed below or above the touch sensor and defines a plurality of opening areas;
   a plurality of color filters which is disposed on the same plane as the black matrix and corresponds to the plurality of opening areas;
   a first buffer layer disposed above the upper one of the touch sensor and the plurality of color filters;
   a thin film transistor disposed above the first buffer layer; and
   an organic light emitting element which is disposed above the thin film transistor and corresponds to the plurality of opening areas,
   wherein the black matrix is disposed on the touch protection layer to be in direct contact with the touch protection layer.

25. An organic light emitting display device, comprising:
   a transparent base member;
   a touch sensor which includes a touch electrode disposed above the transparent base member and a touch protection layer which covers the touch electrode;
   a black matrix which is disposed below or above the touch sensor and defines a plurality of opening areas;
   a plurality of color filters which is disposed on the same plane as the black matrix and corresponds to the plurality of opening areas;
   a first buffer layer disposed above the upper one of the touch sensor and the plurality of color filters;
   a thin film transistor disposed above the first buffer layer; and
   an organic light emitting element which is disposed above the thin film transistor and corresponds to the plurality of opening areas,
   wherein the transparent base member includes an opening pattern or a concave pattern which is inwardly formed from a surface of the transparent base member to allow the organic light emitting display device to be foldable or bendable.

26. An organic light emitting display device, comprising:
a transparent base member;
a touch sensor which includes a touch electrode disposed above the transparent base member and a touch protection layer which covers the touch electrode;
a black matrix which is disposed below or above the touch sensor and defines a plurality of opening areas;
a plurality of color filters which is disposed on the same plane as the black matrix and corresponds to the plurality of opening areas;
a first buffer layer disposed above the upper one of the touch sensor and the plurality of color filters;
a thin film transistor disposed above the first buffer layer; and
an organic light emitting element which is disposed above the thin film transistor and corresponds to the plurality of opening areas,
wherein the transparent base member is a transparent flexible film, and a transparent film is attached to a portion of the transparent flexible film.

* * * * *